(12) United States Patent
Matsuzaki

(10) Patent No.: US 8,779,424 B2
(45) Date of Patent: Jul. 15, 2014

(54) SHEET AND LIGHT-EMITTING DEVICE

(71) Applicant: Panasonic Corporation, Osaka (JP)

(72) Inventor: Jumpei Matsuzaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/919,105

(22) Filed: Jun. 17, 2013

(65) Prior Publication Data

US 2013/0277703 A1    Oct. 24, 2013

Related U.S. Application Data

(63) Continuation of application No. PCT/JP2012/007602, filed on Nov. 27, 2012.

(30) Foreign Application Priority Data

Dec. 7, 2011   (JP) .................................. 2011-268240

(51) Int. Cl.
*H01L 21/48*   (2006.01)

(52) U.S. Cl.
USPC ............ 257/52; 257/40; 257/98; 257/E21.09; 257/E31.061; 257/E51.018

(58) Field of Classification Search
USPC .................. 257/40, 52, 98, E21.009, 31.061, 257/51.018
See application file for complete search history.

(56) References Cited

U.S. PATENT DOCUMENTS

| | | | |
|---|---|---|---|
| 7,307,786 B2 | 12/2007 | Hatjasalo et al. | |
| 7,580,187 B2 | 8/2009 | Kitamura et al. | |
| 7,943,950 B2 | 5/2011 | Bechtel et al. | |
| 8,033,706 B1 * | 10/2011 | Kelly et al. | ............ 362/607 |
| 8,227,966 B2 | 7/2012 | Wakabayashi et al. | |
| 8,586,974 B2 * | 11/2013 | Yamazaki et al. | ............ 257/40 |
| 2004/0046128 A1 * | 3/2004 | Abel et al. | ............ 250/458.1 |
| 2004/0057114 A1 | 3/2004 | Hatjasalo et al. | |
| 2008/0037126 A1 | 2/2008 | Kitamura et al. | |
| 2008/0203421 A1 | 8/2008 | Bechtel et al. | |
| 2010/0046236 A1 | 2/2010 | Nishiwaki | |
| 2011/0080737 A1 | 4/2011 | Nishiwaki et al. | |
| 2011/0080738 A1 | 4/2011 | Wakabayashi et al. | |

(Continued)

FOREIGN PATENT DOCUMENTS

| | | |
|---|---|---|
| JP | 2004-111493 | 4/2004 |
| JP | 2004-525396 | 8/2004 |

(Continued)

OTHER PUBLICATIONS

International Search Report issued Feb. 5, 2013 in International (PCT) Application No. PCT/JP2012/007602.

*Primary Examiner* — Michael Lebentritt
(74) *Attorney, Agent, or Firm* — Wenderoth, Lind & Ponack, L.L.P.

(57) ABSTRACT

A sheet for use in a light-emitting device including layers including a light-emitting layer was invented. The sheet includes: a first layer including a plurality of projecting portions; and a second layer on the first layer, in which the projecting portions each include at least two steps, the second layer is formed on top at least surfaces of the steps, and when an effective refractive index of the first layer is $n_1$, an effective refractive index of the second layer is $n_2$, and an effective refractive index of the air above the second layer is $n_0$, a relationship $n_1 > n_2 > n_0$ is satisfied.

15 Claims, 22 Drawing Sheets

(56) References Cited

U.S. PATENT DOCUMENTS

| | | | |
|---|---|---|---|
| 2011/0090697 A1 | 4/2011 | Matsuzaki et al. | |
| 2011/0133624 A1 | 6/2011 | Wakabayashi et al. | |
| 2011/0315988 A1* | 12/2011 | Yu et al. | 257/52 |
| 2012/0049170 A1 | 3/2012 | Yamae et al. | |
| 2012/0063145 A1 | 3/2012 | Matsuzaki et al. | |
| 2012/0161115 A1* | 6/2012 | Yamazaki et al. | 257/40 |
| 2013/0277703 A1* | 10/2013 | Matsuzaki | 257/98 |

FOREIGN PATENT DOCUMENTS

| | | |
|---|---|---|
| JP | 2008-537291 | 9/2008 |
| JP | 2008-258302 | 10/2008 |
| JP | 2009-217292 | 9/2009 |
| JP | 2010-198881 | 9/2010 |
| JP | 2011-181269 | 9/2011 |
| WO | 02/48758 | 6/2002 |
| WO | 2005/124403 | 12/2005 |
| WO | 2006/109222 | 10/2006 |
| WO | 2009/063636 | 5/2009 |
| WO | 2010/073585 | 7/2010 |
| WO | 2010/131430 | 11/2010 |
| WO | 2010/131434 | 11/2010 |
| WO | 2010/131439 | 11/2010 |
| WO | 2010/131440 | 11/2010 |

* cited by examiner (a)

(b)

(c)

SHEET AND LIGHT-EMITTING DEVICE

CROSS REFERENCE TO RELATED APPLICATIONS

This is a continuation application of PCT International Application No. PCT/JP2012/007602 filed on Nov. 27, 2012, designating the United States of America, which is based on and claims priority of Japanese Patent Application No. 2011-268240 filed on Dec. 7, 2011. The entire disclosures of the above-identified applications, including the specifications, drawings and claims are incorporated herein by reference in their entirety.

FIELD

One or more exemplary embodiments disclosed herein relate generally to sheets and light-emitting devices and, in particular, to a transparent sheet having one surface adjacent to a phosphor and a light-emitting device including the sheet.

BACKGROUND

Some of light-emitting devices used as displays and lightings, for example use organic electroluminescence elements (organic EL elements), for example. FIG. 19 illustrates the overview of a cross-sectional structure of a light-emitting device using a general organic EL element and how light propagates.

As shown in FIG. 19, a light-emitting device 100 using an organic EL element includes a substrate 101, a reflecting electrode 102, a light-emitting layer 103, and a transparent electrode 104 which are formed in sequence above the substrate 101, and a transparent substrate 105 provided on the transparent electrode 104. When a voltage is applied between the reflecting electrode 102 and the transparent electrode 104, the light-emitting layer 103 emits light in this light-emitting device 100. At this time, for example, as shown in FIG. 19, when light is emitted at a luminous point S in the light-emitting layer 103, this light is transmitted through the transparent electrode 104 directly or after being reflected by the reflecting electrode 102, and is incident on a point P on the surface of the transparent substrate 105 at an incidence angle $\theta_1$ with respect to the plane normal to the surface of the transparent substrate 105. This light is refracted at this point P at a refraction angle $\theta_0$ and outputted to an air layer 20.

Here, in the case where the refractive index of the transparent substrate 105 is n, when the incidence angle $\theta_1$ becomes greater than a critical angle $\theta_c = \sin^{-1}(1/n)$, total reflection occurs. For example, when light from the point S in the light-emitting layer 103 is incident on a point Q on the surface of the transparent substrate 105 at an incidence angle greater than or equal to the critical angle $\theta_c$, this light is totally reflected at the point P and is not outputted to the air layer 20.

With reference to FIG. 20A, the following describes light extraction efficiency when the transparent layer on the light-emitting layer 103 in FIG. 19 (transparent electrode 104 and transparent substrate 105) has a multi-layer structure. FIG. 20A illustrates how light propagates on an assumption that the transparent layer in the light-emitting device shown in FIG. 19 has the multi-layer structure.

As shown in FIG. 20A, the refractive index of the light-emitting layer 103 is $n_k$, the refractive index of the air layer 20 is $n_0$, and the refractive indices of multiple transparent layers provided between the light-emitting layer 103 and the air layer 20 are $n_{k-1}, n_{k-2}, \ldots, n_1$ in the order closest to the light emitting layer 103. The propagation orientation of light emitted at the luminous point S in the light emitting layer 103 (angle between the refracting surface and the plane normal) is $\theta_k$. The refraction angles on the refracting surfaces are $\theta_{k-1}, \theta_{k-2}, \ldots, \theta_1, \theta_0$ in the order closest to the light-emitting layer 103. Here, the following expression (expression 1) holds based on the Snell's Law.

$$n_k \sin\theta_k = n_{k-1}\sin\theta_{k-1} = \ldots = n_1\sin\theta_1 = n_0\sin\theta_0 \quad \text{(Expression 1)}$$

The following expression (expression 2) holds from this expression 1.

$$\sin\theta_k = \sin\theta_0 \times n_0/n_k \quad \text{(Expression 2)}$$

Expression 2 is nothing but the Snell's Law when the light emitting layer 103 is in direct contact with the air layer 20, and represents that total reflection occurs at $\theta_k \geq \theta c = \sin^{-1}(n_0/n_k)$ regardless of the refractive indices of the transparent layers provided between the light emitting layer 103 and the air layer 20.

Moreover, FIG. 20B schematically illustrates a range of light which can be extracted from the light emitting layer in the light-emitting device shown in FIG. 19.

As shown in FIG. 20B, light which can be extracted from the light-emitting layer 103 is contained in a pair of cones 301 and 302, i.e., a pair of cones having the light emitting point S in the light-emitting layer 103 as the apex, an angle being twice the critical angle $\theta_c$ as the vertex angle, and z axis along the plane normal to the refracting surface as the central axis. Assuming that the light emitted from the luminous point S radiates in all directions at an equal intensity, and transmittance on the refracting surface is 100% when the incidence angle is within the critical angle $\theta_c$, the light extraction efficiency $\eta$ from the light emitting layer 103 is equal to the ratio of the area obtained by cutting a spherical surface 303 with the cones 301 and 302 to the surface area of the spherical surface 303 and, is given by the following expression.

$$\eta = 1 - \cos\theta c \quad \text{(Expression 3)}$$

It should be noted that since the transmittance within the critical angle $\theta_c$ is not 100%, the actual extraction efficiency $\eta$ is smaller than $(1 - \cos\theta c)$. Moreover, the total efficiency for the light-emitting device is a value obtained by multiplying the light extraction efficiency $\eta$ by the light emitting efficiency of the light-emitting layer 103.

For instance, when $n_0 = 1.0$ and $n_k = 1.457$ in Expression 2, the critical angle $\theta c = \sin^{-1}(n_0/n_k) = 43.34$ degrees and the light extraction efficiency $\eta$ is small at around $1 - \cos\theta c = 0.273$. When $n_k = 1.70$, the light extraction efficiency $\eta$ decreases to around 0.191. Thus, conventional light-emitting devices can only use around 20% of emission energy due to the total reflection. This leads to decrease in luminance and increase in power consumption.

Therefore, in order to improve light emitting efficiency without degrading viewing angle characteristics, sheets having a structure in which light incident at a critical angle or greater is transmitted irrespective of emission wavelength are suggested (Patent Literature 1).

FIG. 21 illustrates the light extraction structure disclosed in Patent Literature 1. (a) in FIG. 21 illustrates patterns of the surface structure in the light extraction structure disclosed in Patent Literature 1. (b) in FIG. 21 is a partially enlarged view of the patterns illustrated in (a) in FIG. 21. (c) in FIG. 21 is a cross-sectional view taken along the line A-A in (b) in FIG. 21.

As shown in FIG. 21, the light extraction structure 400 disclosed in Patent Literature 1 is virtually divided into small square-shaped areas having a certain width w (hereinafter referred to as "boundary width") and a certain depth d, providing no space between the small square-shaped areas, and is a recess and projection structure in which the recessed portion 401 and the projecting portion 402 are randomly allocated.

Thus, when the light extraction structure 400 is the recess and projection structure, incident light incident at a critical angle or greater can be extracted, and light can be extracted without orientation polarization by randomly allocating recessed portions and projecting portions. Thus, total luminous flux can be increased and improvement effects for luminance and a color viewing angle can be obtained. Therefore, by using sheets having the light extraction structure disclosed in Patent Literature 1, light extraction efficiency can be improved without ruing their appearances in light-emitting devices such as displays and lightings, and improvement of luminance, reduction in power consumption and extension of life of elements can be achieved.

CITATION LIST

Patent Literature

[PTL 1] Japanese Unexamined Patent Application Publication No. 2009-217292

SUMMARY

Technical Problem

In the light extraction structure disclosed in Patent Literature 1, however, absorption of light which is repeatedly reflected in a light-emitting device is not taken into account. Therefore, there is a problem that the total efficiency of a whole light-emitting device changes according to a selected material or structure of an organic EL.

One non-limiting and exemplary embodiment improves the efficiency of first extraction and provides a sheet and a light-emitting device which are less likely to be subject to light absorption in the light-emitting device.

Solution to Problem

In one general aspect, the techniques disclosed here feature a sheet for use in a light-emitting device including a plurality of layers including a light-emitting layer, the sheet including: a first layer including a plurality of projecting portions; and a second layer on the first layer, in which the projecting portions each include at least two steps, the second layer is formed on at least top surfaces of the steps, and when an effective refractive index of the first layer is $n_1$, an effective refractive index of the second layer is $n_2$, and a refractive index of the air above the second layer is $n_0$, a relationship $n_1 > n_2 > n_0$ is satisfied.

In another general aspect, the techniques disclosed here feature a light-emitting device including a plurality of layers including a light-emitting layer. The light-emitting device includes: a first layer including a plurality of projecting portions; a second layer on the first layer; and a third layer on the second layer, in which the projecting portions each include at least two steps, the second layer is formed on at least top surfaces of the steps, when an effective refractive index of the first layer is $n_1$, an effective refractive index of the second layer is $n_2$, and a refractive index of the third layer is $n_3$, a relationship $n_1 > n_2 > n_3$ is satisfied, and the first layer, the second layer, and the third layer are provided in the order of the first layer, the second layer, and the third layer in a direction from the light-emitting layer toward the air.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

According to one or more exemplary embodiments or features disclosed herein, first light incident at an incidence angle greater than or equal to a critical angle can be efficiently extracted. Therefore, a light-emitting device is less likely to be subject to light absorption in the light-emitting device at the time of multiple reflection. Thus, it is possible to improve light extraction efficiency even if a structure or a material which absorbs a large amount of light is used for the light-emitting device.

BRIEF DESCRIPTION OF DRAWINGS

These and other advantages and features will become apparent from the following description thereof taken in conjunction with the accompanying Drawings, by way of non-limiting examples of embodiments disclosed herein.

Figure 2:
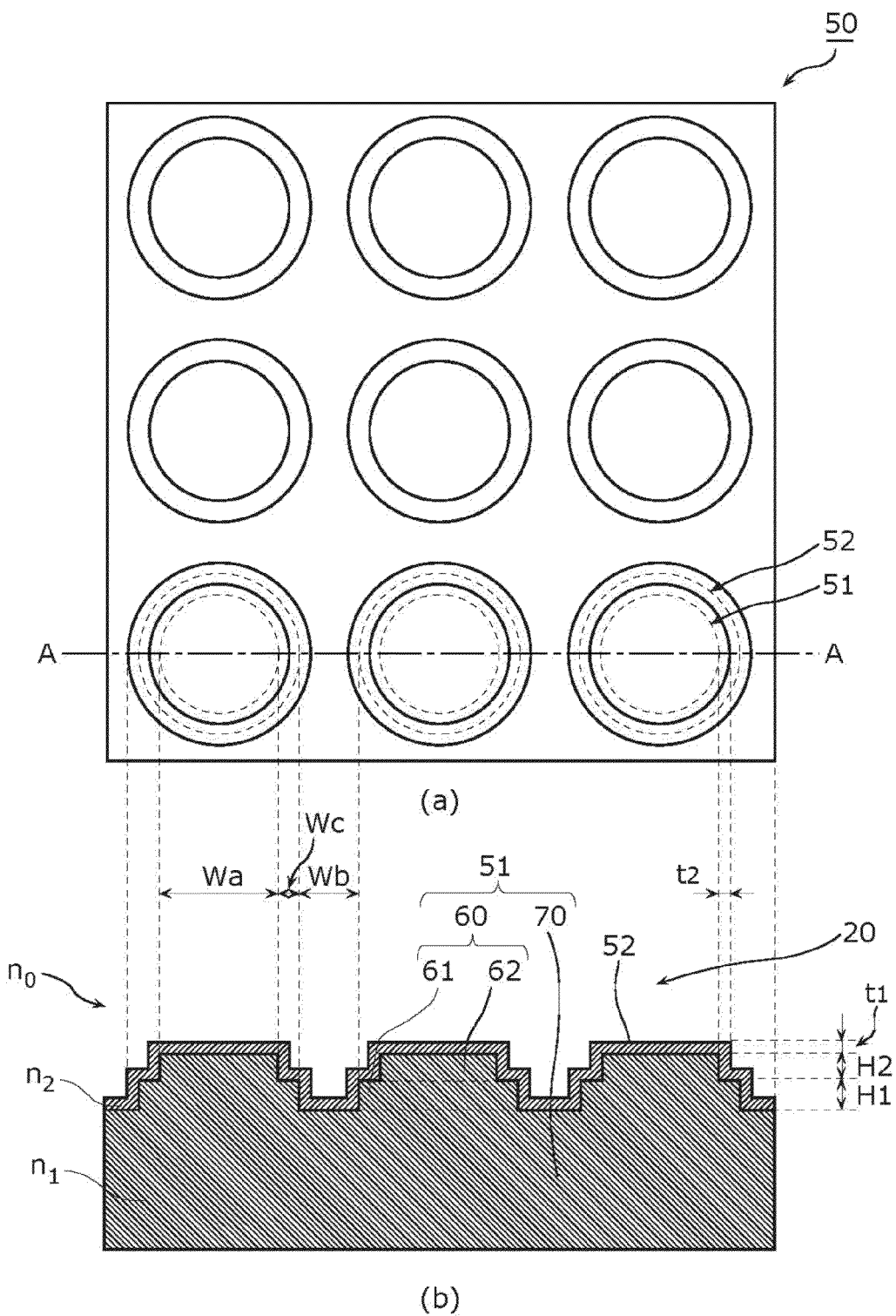

(a) in FIG. 2 is an enlarged plan view of a surface structure of a transparent substrate in a light-emitting device according to the first embodiment. (b) in FIG. 2 is a cross-sectional view taken along the line A-A in (a) in FIG. 2.

Figure 3:
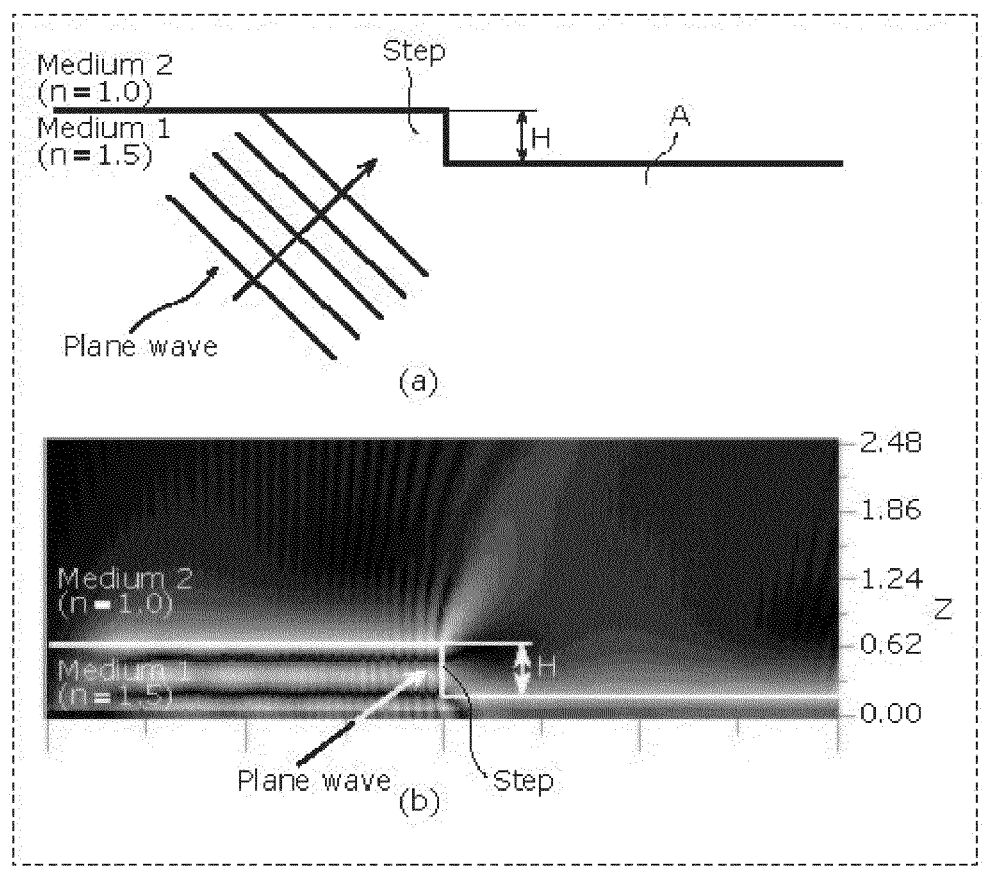

(a) in FIG. 3 is a schematic cross-sectional view when a step having a height H is provided to a medium A having a refractive index of 1.5. (b) in FIG. 3 illustrates electric field contour which shows a result of electromagnetic field analysis in (a) in FIG. 3.

Figure 4:
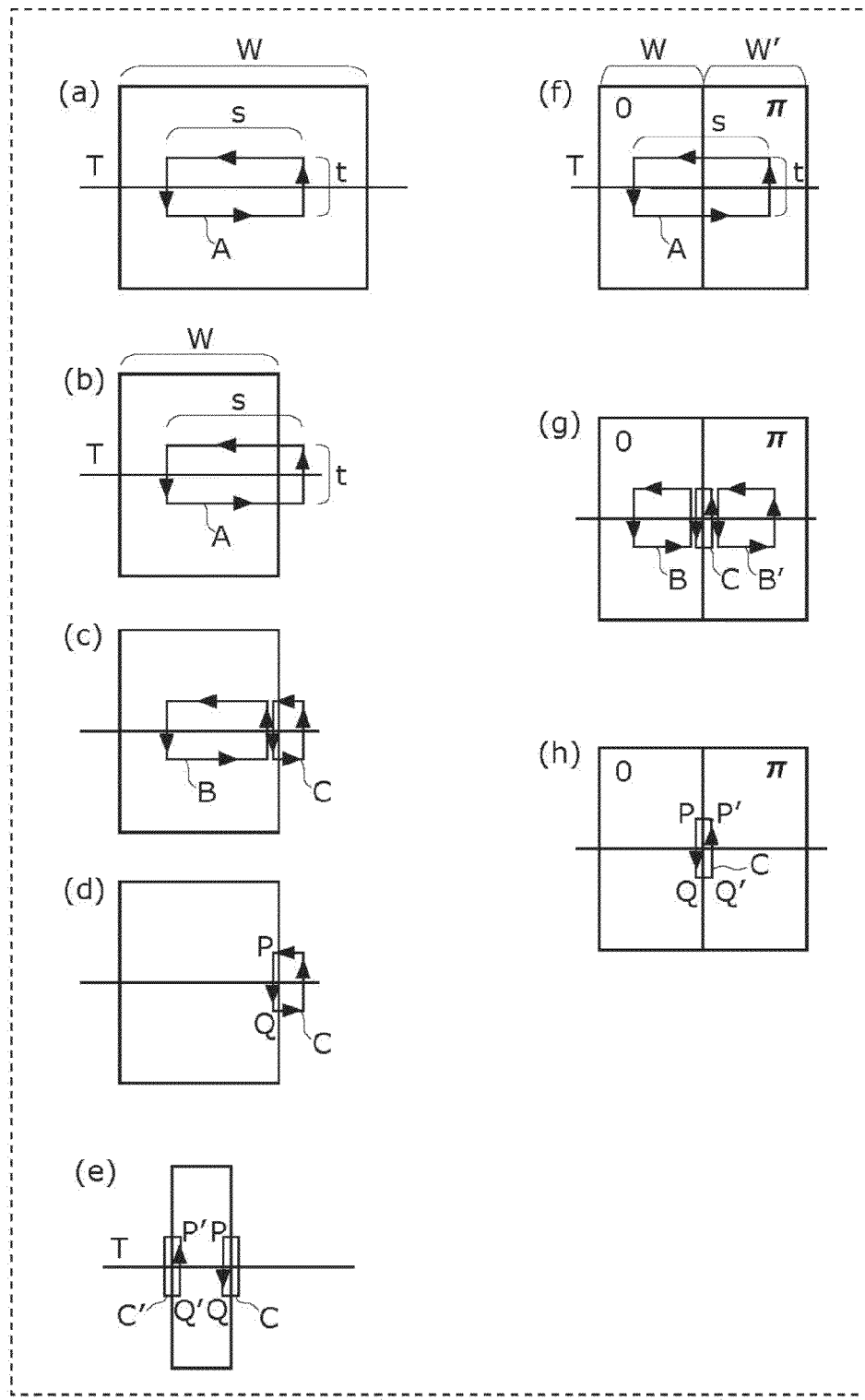

(a) to (h) in FIG. 4 show boundary conditions of an optical field on a refracting surface.

Figure 5:
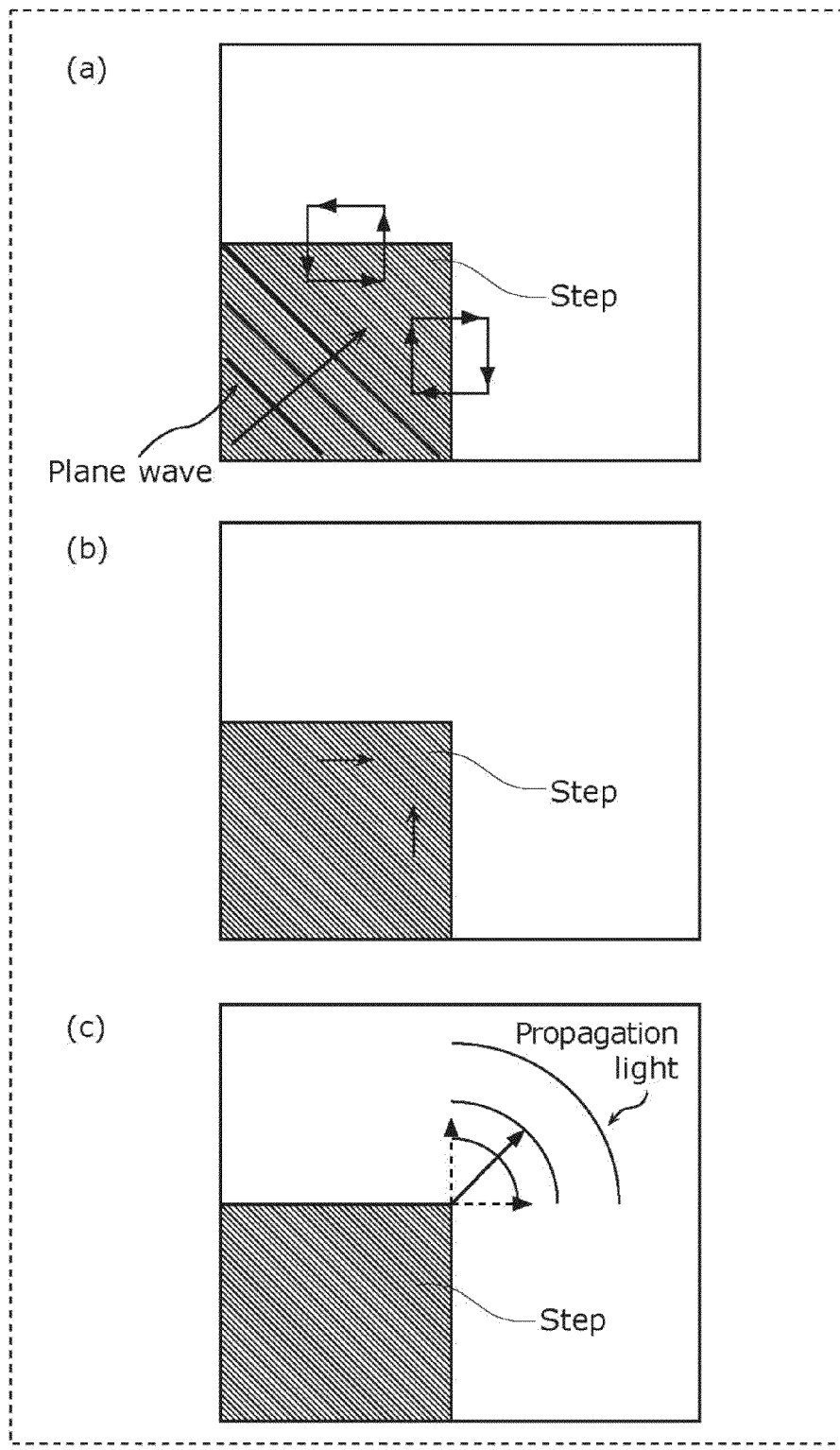

(a) to (c) in FIG. 5 show an electric field vector at a corner of a step in a step structure.

Figure 6:
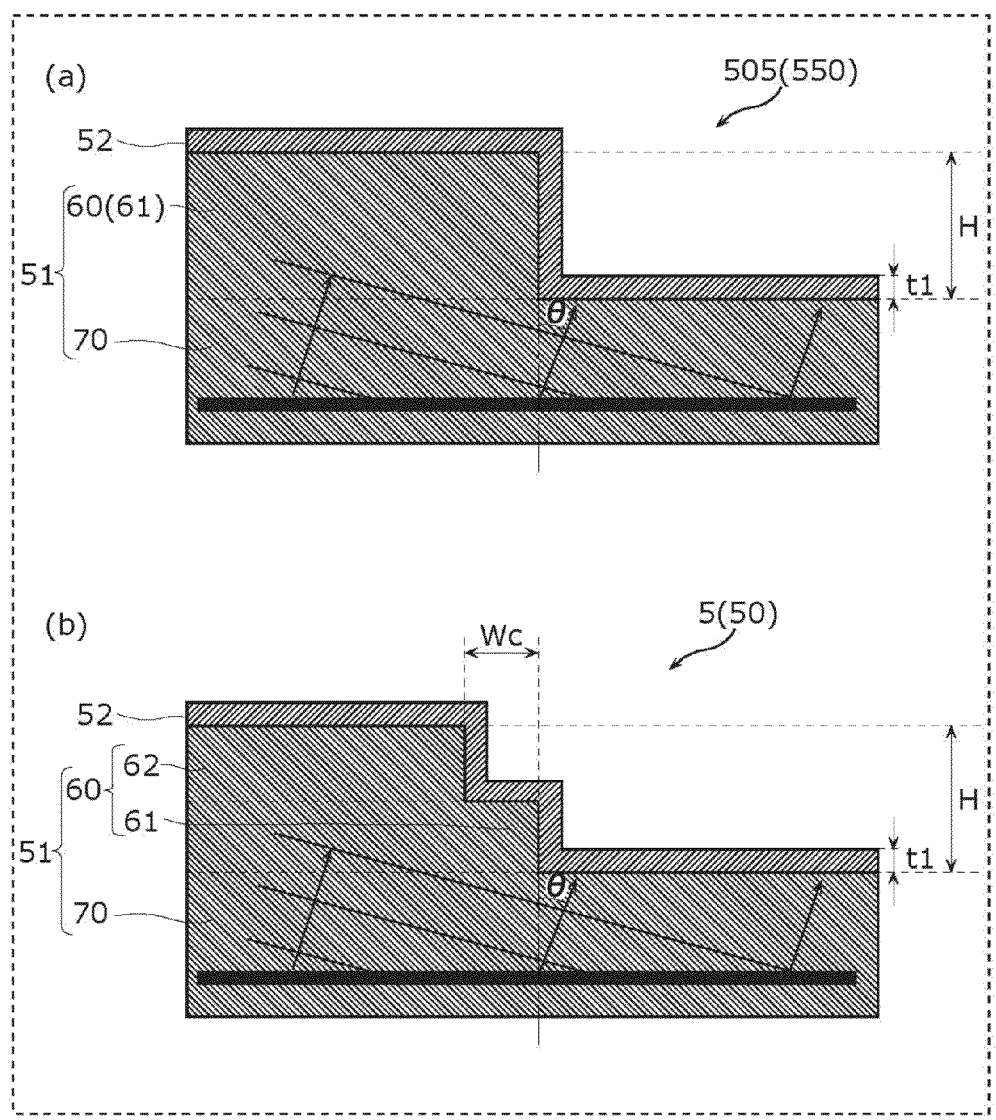

(a) in FIG. 6 is an enlarged cross-sectional view of a light-emitting device including a transparent substrate of a surface structure having one step (single level) according to the first comparative example. (b) in FIG. 6 is an enlarged cross-sectional view of a light-emitting device including a transparent substrate of a surface structure having two steps (multilevel) according to the first embodiment.

Figure 7:
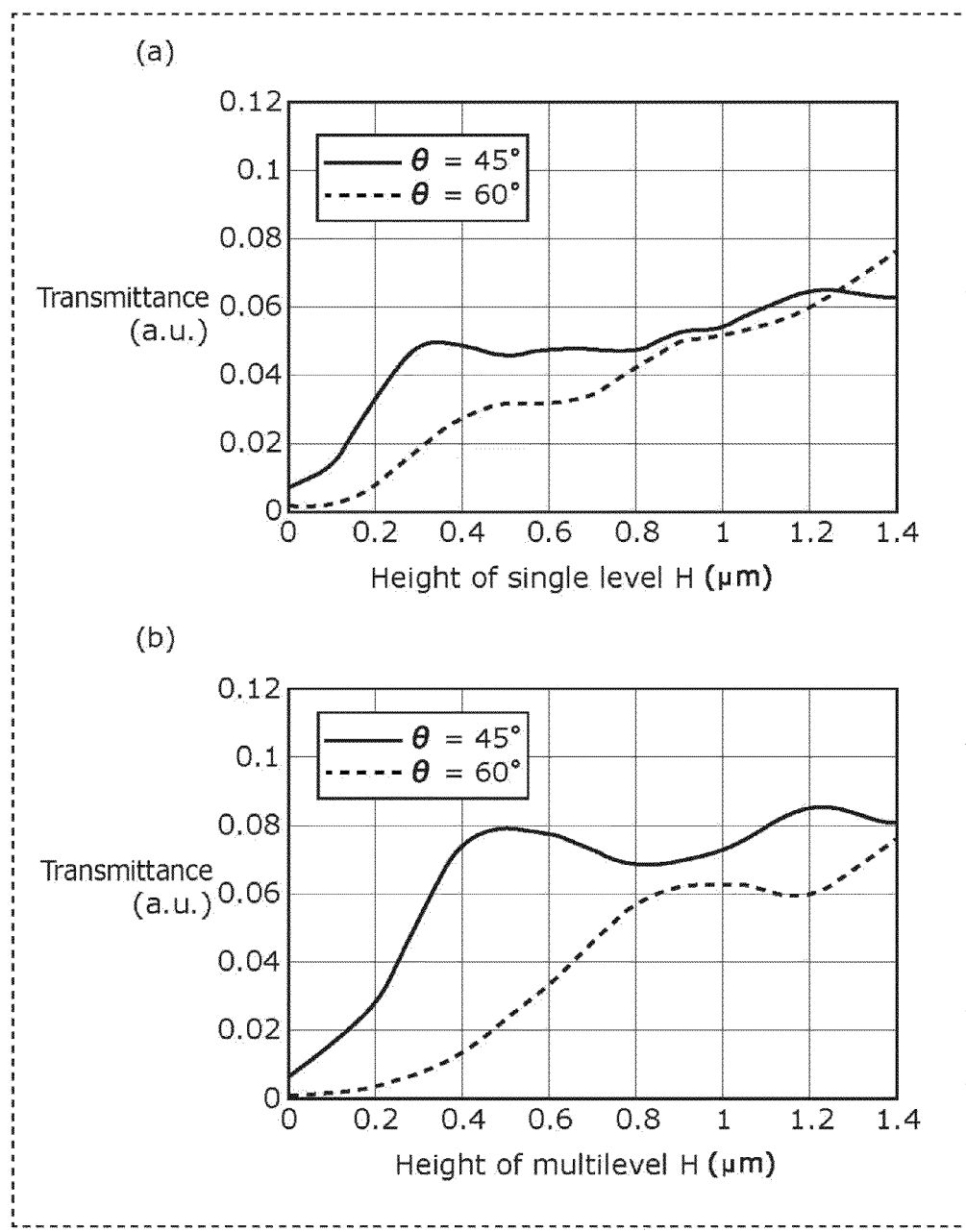

(a) in FIG. 7 shows dependence of transmittance on the height of a structure in the single level structure (first comparative example) shown in (a) in FIG. 6. (b) in FIG. 7 shows dependence of transmittance on the height of a structure in the multilevel structure (embodiment of present disclosure) shown in (b) in FIG. 6.

Figure 8:
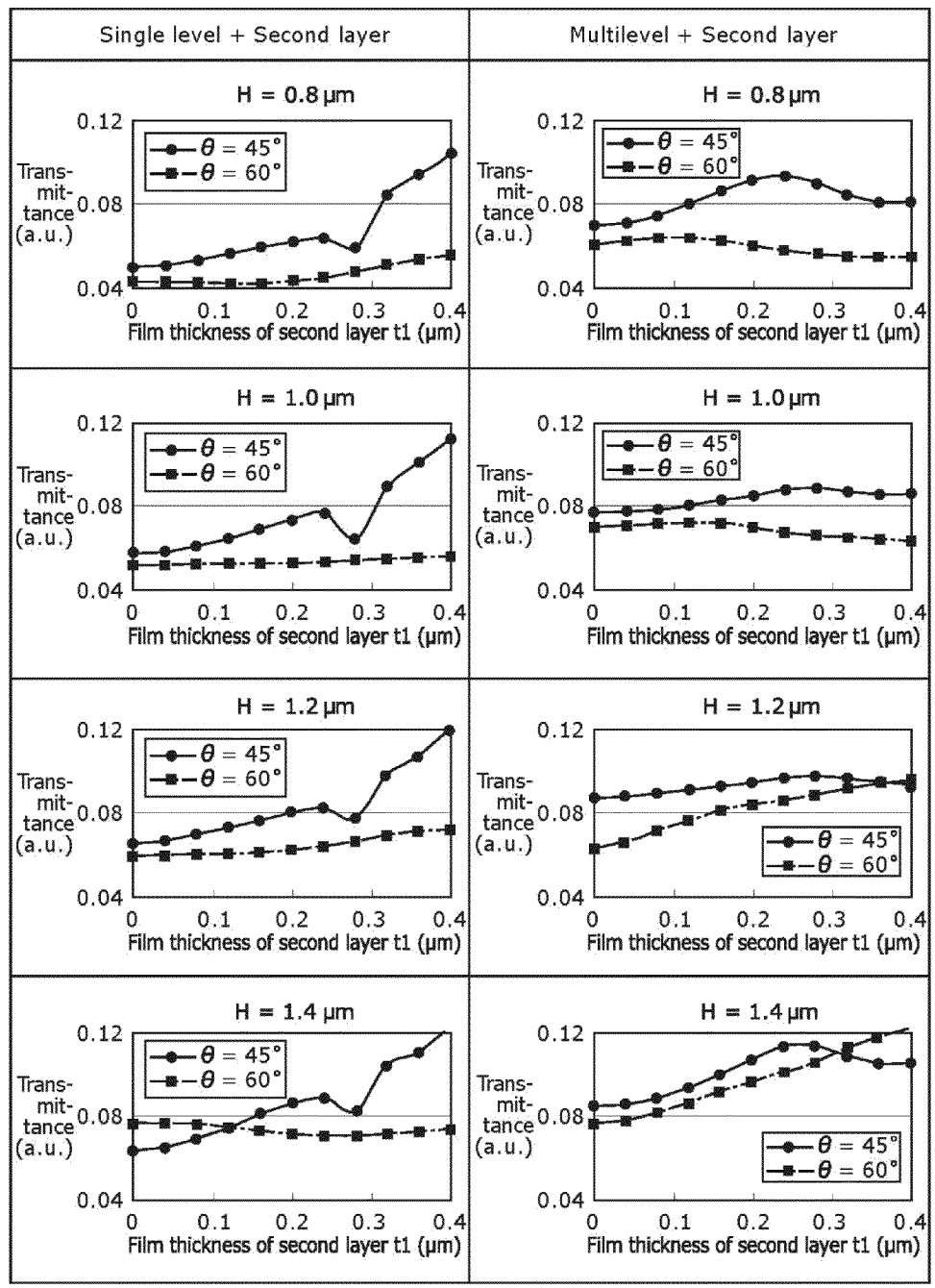

FIG. 8 shows a comparison of dependence of transmittance on a film thickness for each of structure heights in a surface structure when a second layer is added to the single level structure (first comparative example) shown in (a) in FIG. 6 and the multilevel structure (embodiment of present disclosure) shown in (b) in FIG. 6.

Figure 9:
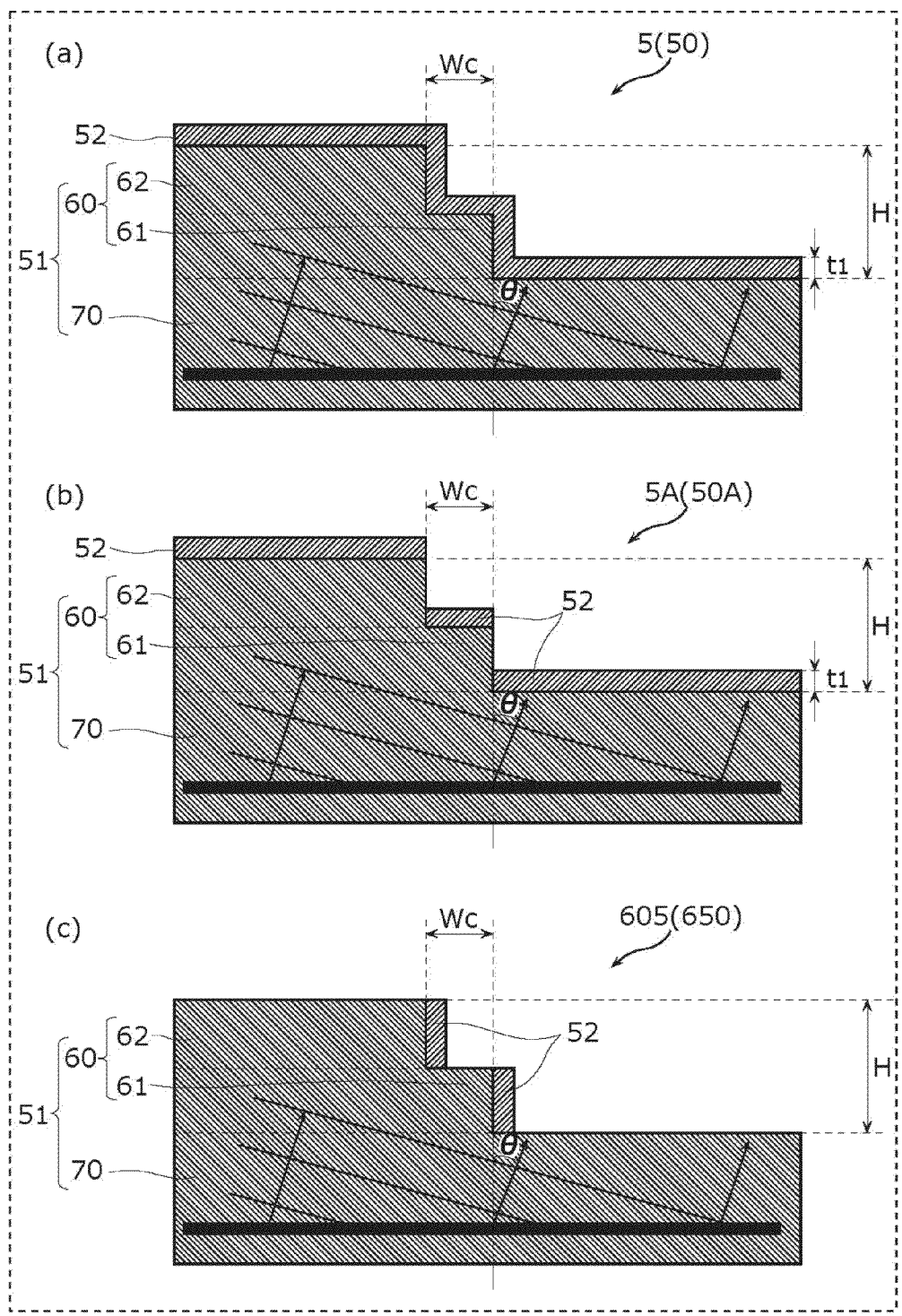

(a) in FIG. 9 is an enlarged cross-sectional view of a surface structure of a light-emitting device according to the first embodiment shown in FIG. 2. (b) in FIG. 9 is an enlarged cross-sectional view of a surface structure of a light-emitting device according to the modification of the first embodiment.

(c) in FIG. 9 is an enlarged cross-sectional view of a surface structure of a light-emitting device according to the second comparative example.

Figure 10:
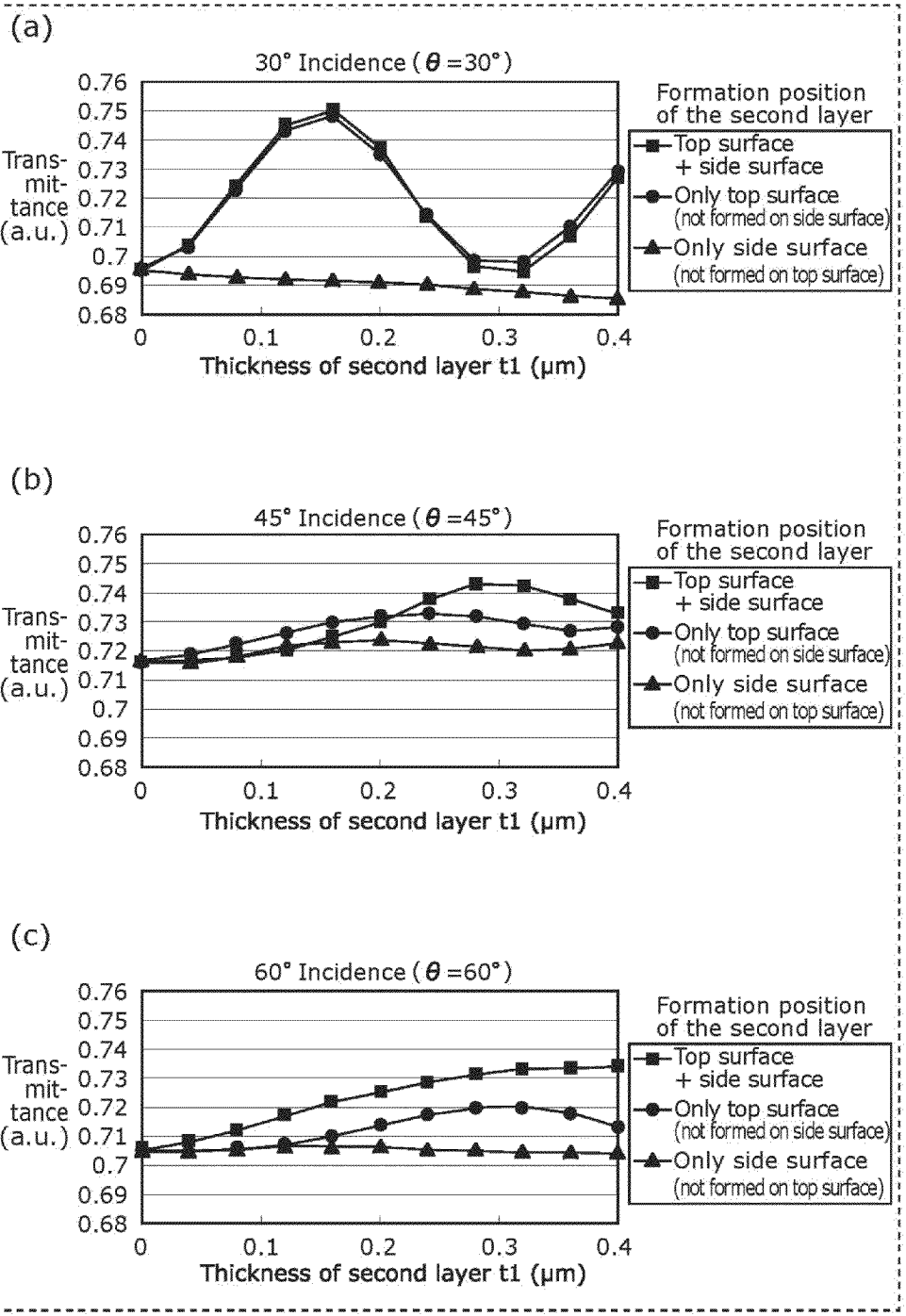

FIG. 10 shows dependence of transmittance with respect to the incidence angle θ on the film thickness of the second layer in the structures shown in (a) to (c) in FIG. 9. (a) in FIG. 10 shows transmittance characteristics when the incidence angle θ is 30 degrees. (b) in FIG. 10 shows transmittance characteristics when the incidence angle θ is 45 degrees. (c) in FIG. 10 shows transmittance characteristics when the incidence angle θ is 60 degrees.

Figure 11:
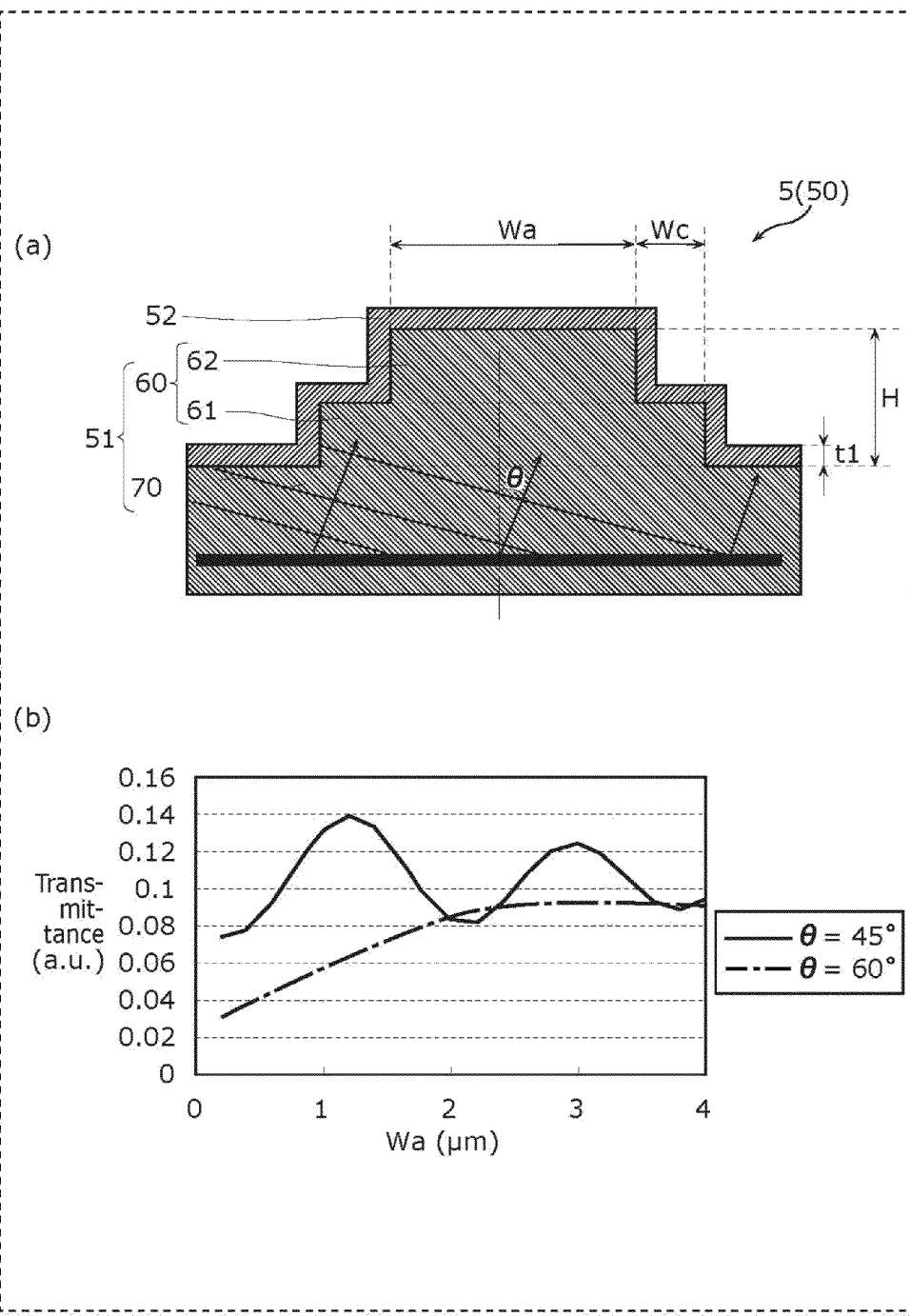

(a) in FIG. 11 is an enlarged cross-sectional view of the projecting portion and its vicinity in a surface structure of a light-emitting device according to the first embodiment, (b) in FIG. 11 shows dependence of transmittance on Wa in the surface structure of the same light-emitting device.

Figure 12:
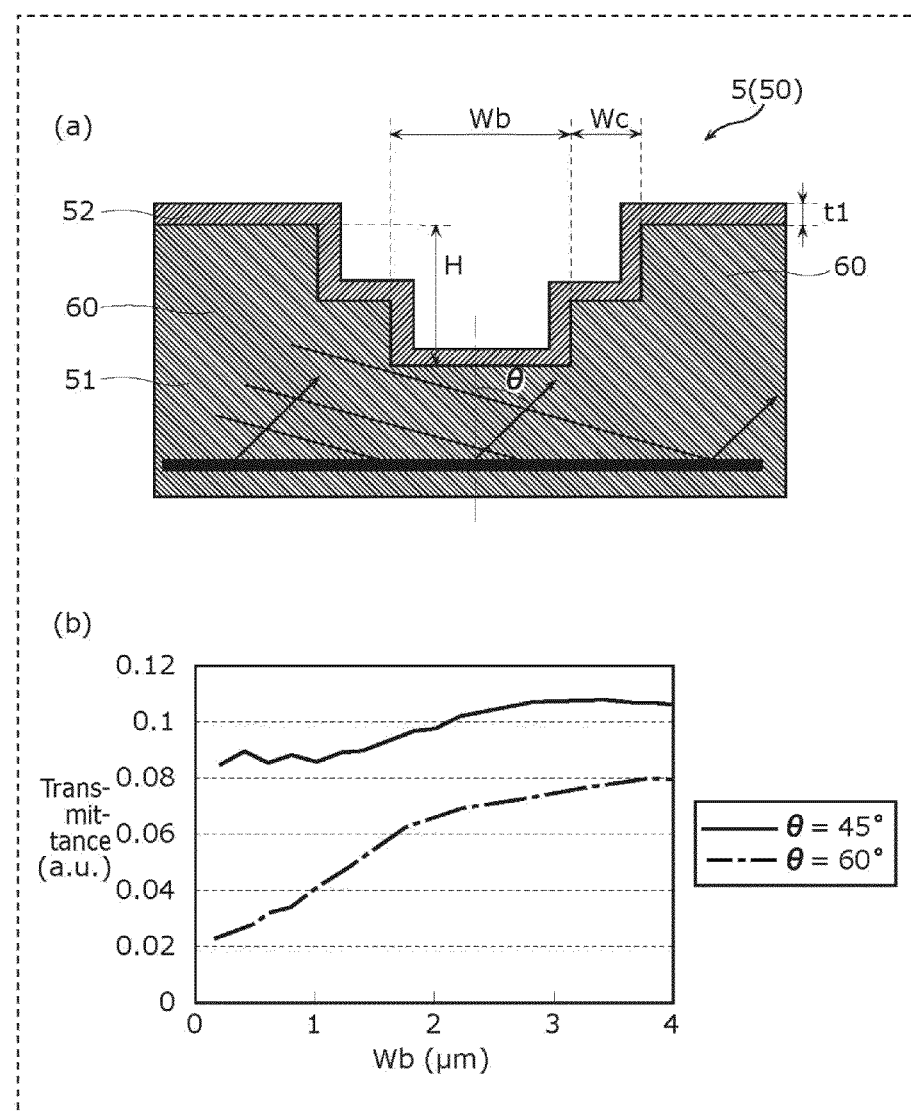

(a) in FIG. 12 is an enlarged cross-sectional view of the recessed portion (between projecting portions) and its vicinity in a surface structure of a light-emitting device according to the first embodiment. (b) in FIG. 12 shows dependence of transmittance on Wb in the surface structure of the same light-emitting device.

Figure 13:
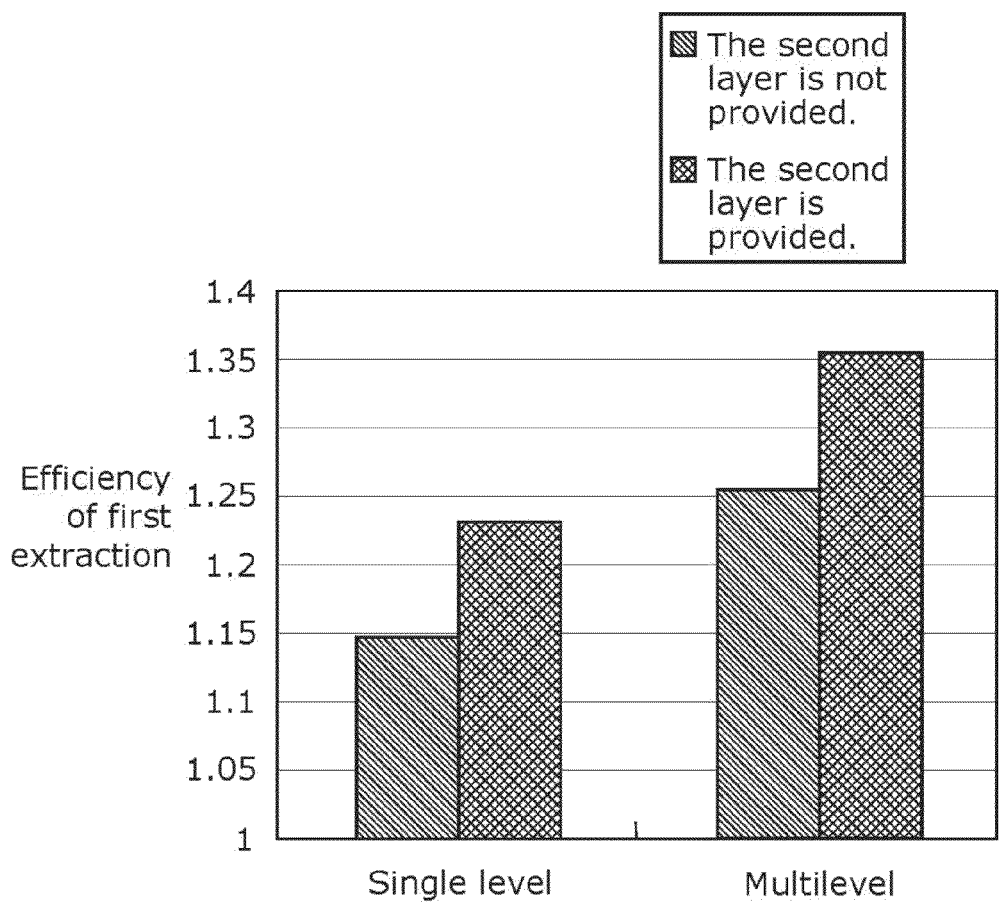

FIG. 13 shows a comparison of the efficiency of first extraction in the surface structure (single level) according to the first comparative example shown in (a) in FIG. 6 and the efficiency of first extraction in the surface structure (multi-level) according to the first embodiment shown in (b) in FIG. 6.

Figure 14:
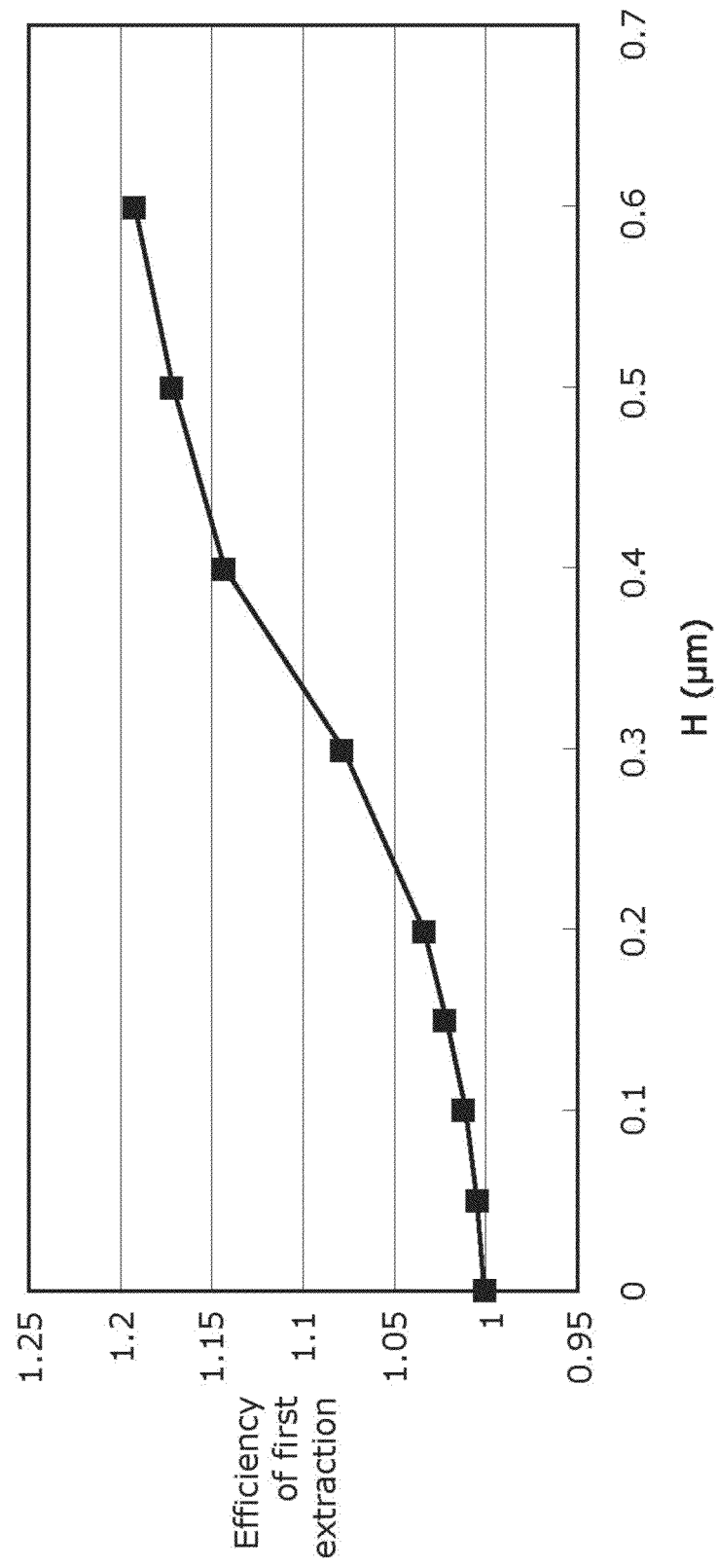

FIG. 14 shows the relationship between the height of each step and the efficiency of first extraction in a light-emitting device of the multilevel structure.

Figure 15:
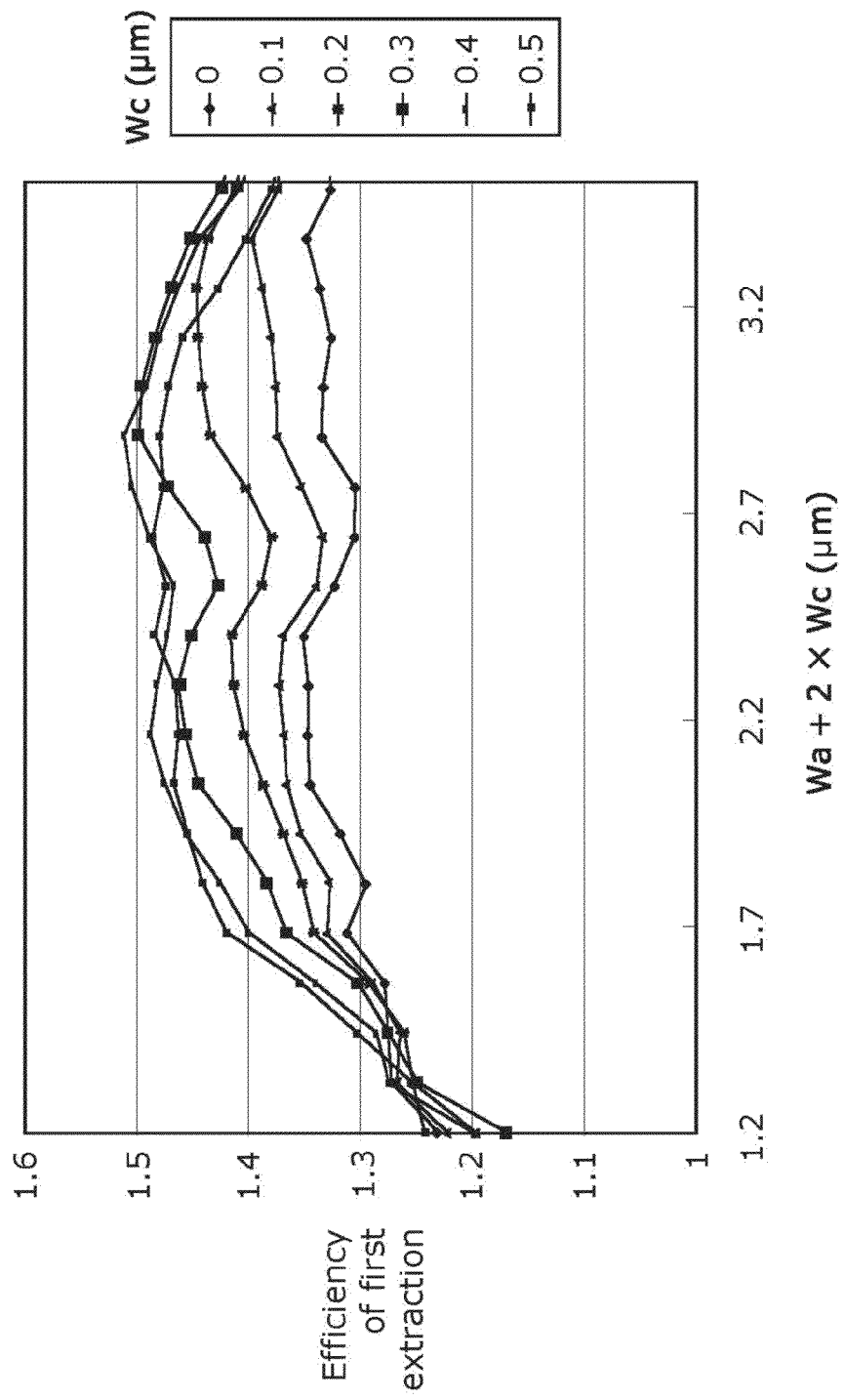

FIG. 15 shows the relationship between the efficiency of first extraction and the full width or the step width of a projecting portion in a surface structure of a light-emitting device according to the first embodiment.

Figure 16:
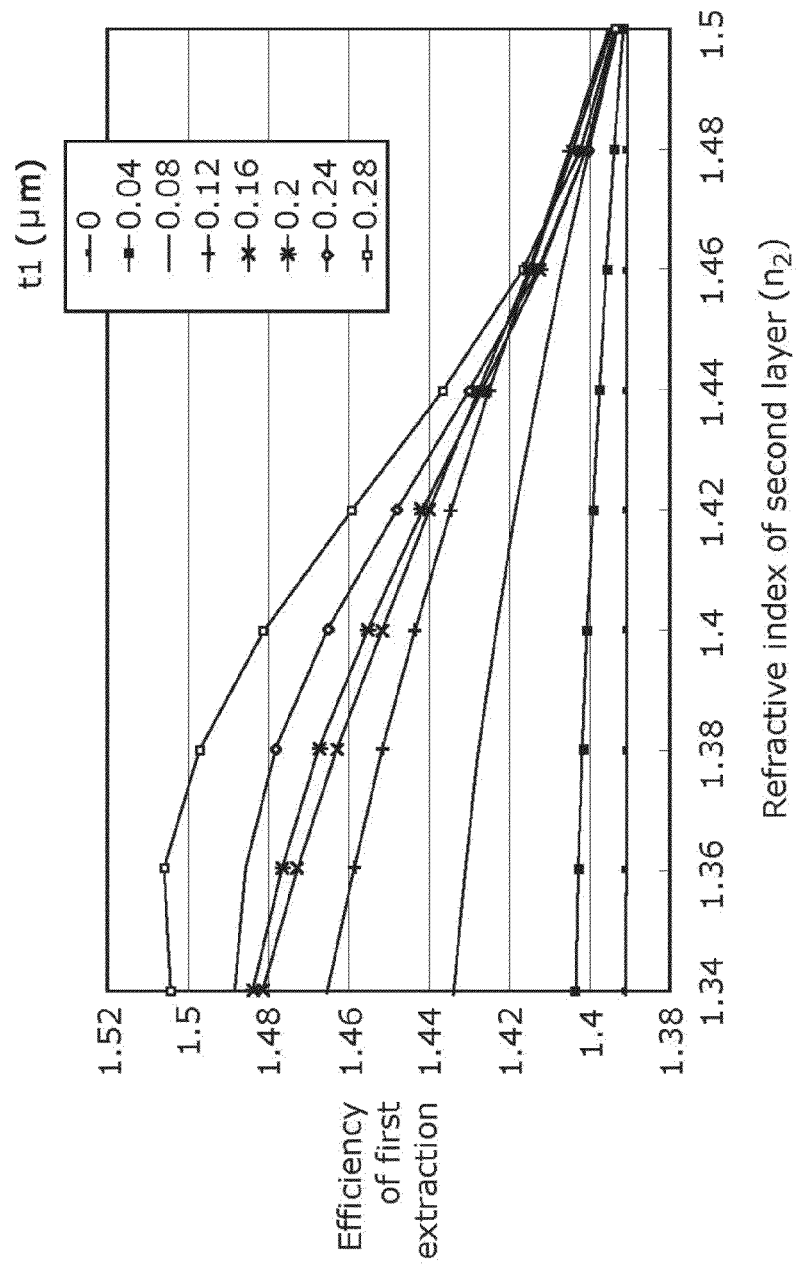

FIG. 16 shows the relationship between the efficiency of first extraction and the refractive index of a second layer in a surface structure of a light-emitting device according to the first embodiment.

Figure 17:
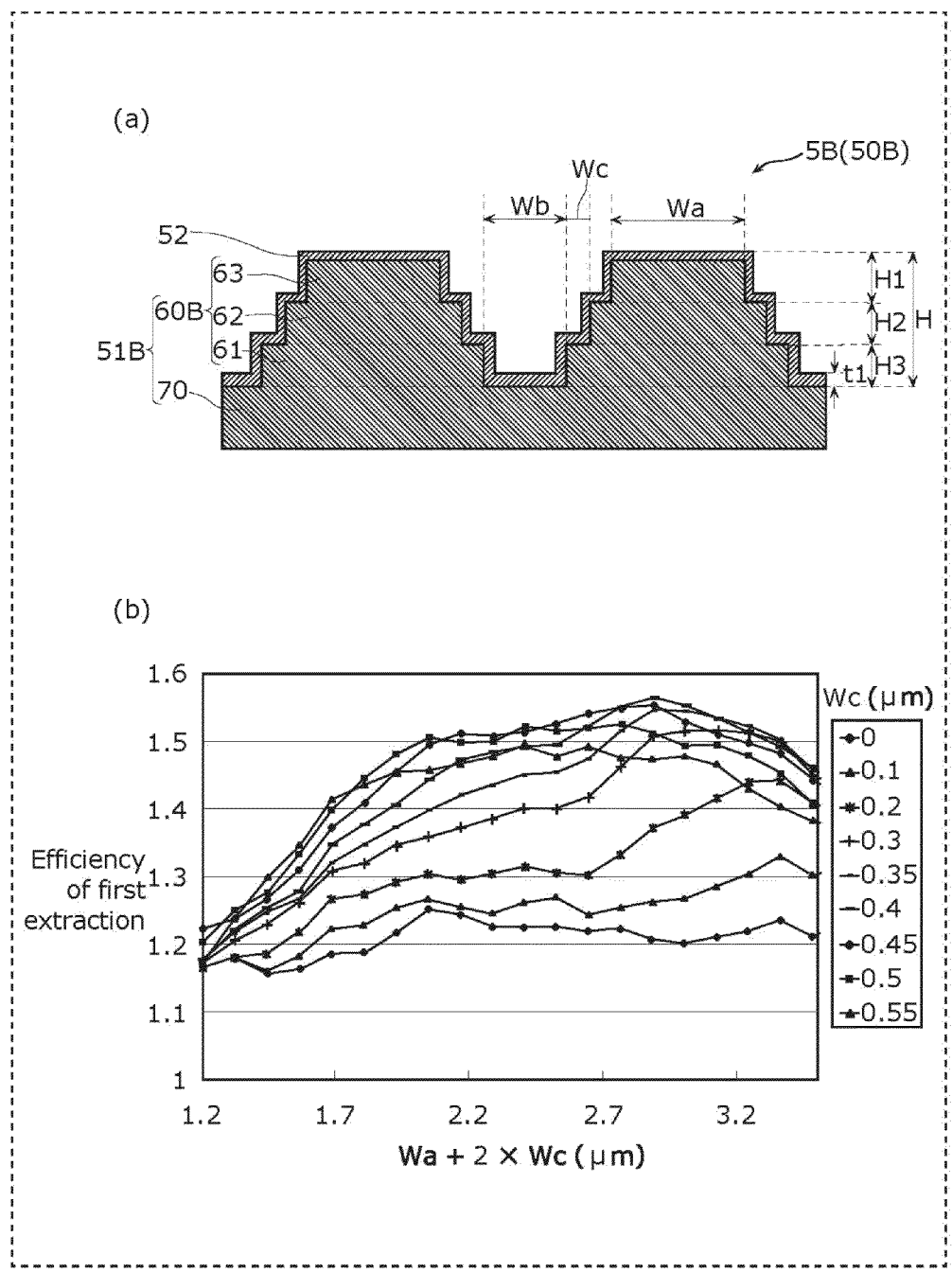

(a) in FIG. 17 is an enlarged cross-sectional view of a light-emitting device according to the second embodiment. (b) in FIG. 17 shows the relationship between the efficiency of first extraction and the full width or the step width of the projecting portion in a surface structure of the light-emitting device shown in (a) in FIG. 17.

Figure 18:
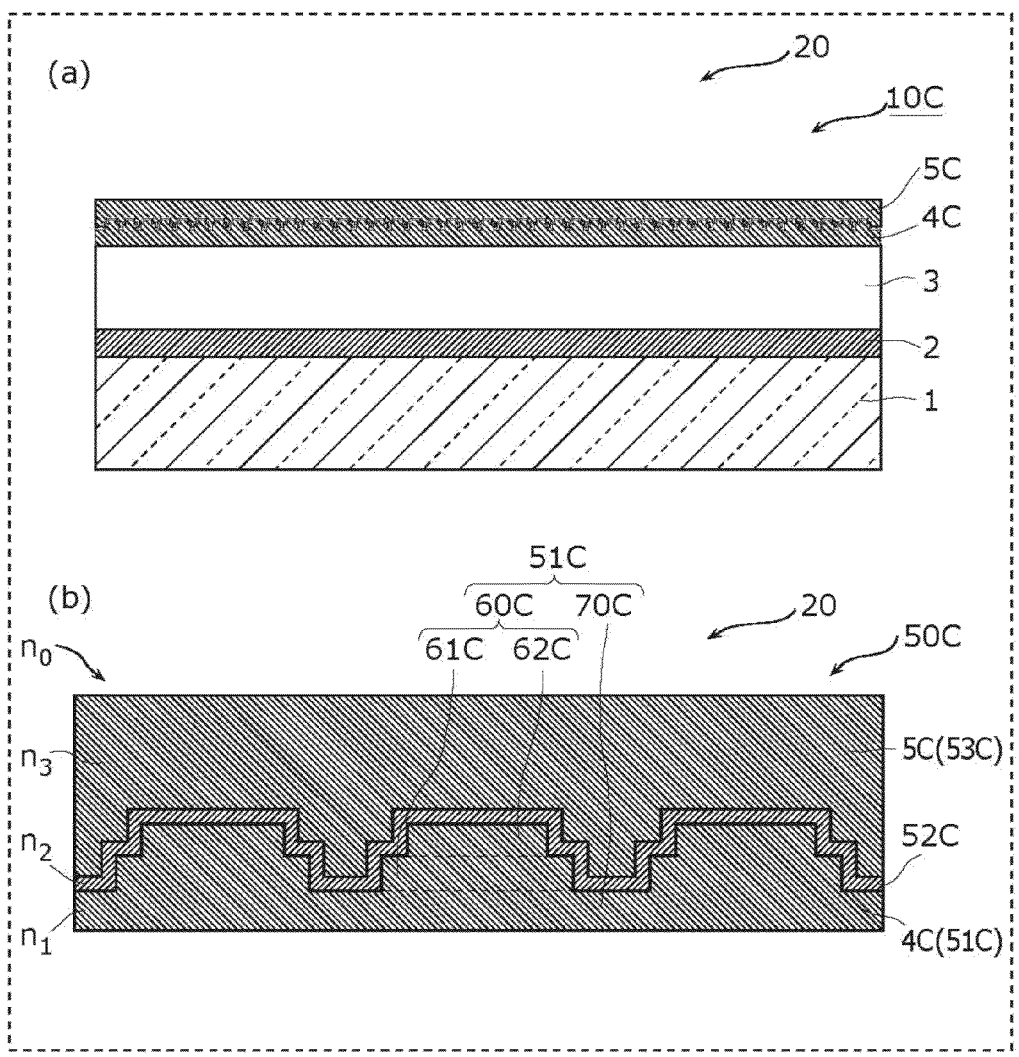

(a) in FIG. 18 is a cross-sectional view of a light-emitting device according to the third embodiment. (b) in FIG. 18 is an enlarged view of the surface structure and its vicinity of the light-emitting device shown in (a) in FIG. 18.

Figure 19:
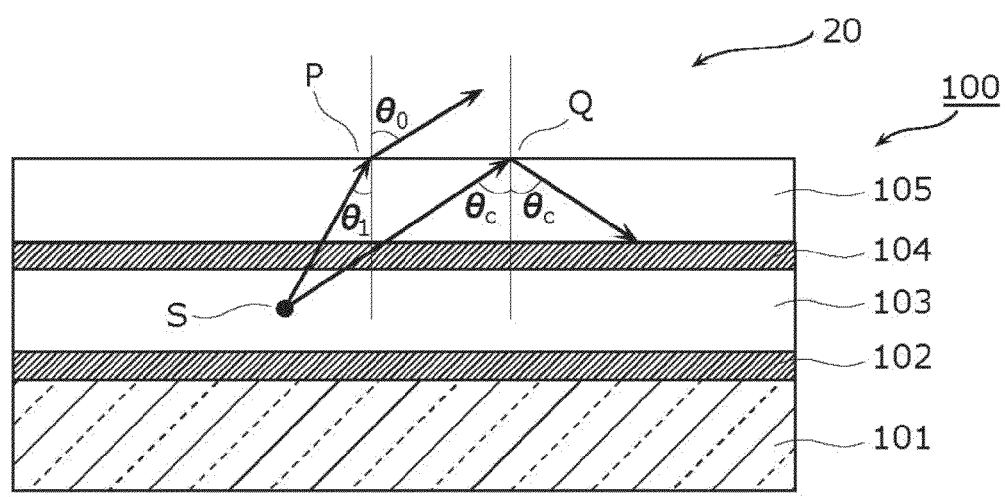

FIG. 19 illustrates the overview of a cross-sectional structure of a light-emitting device using a general organic EL element and how light propagates.

Figure 20A:
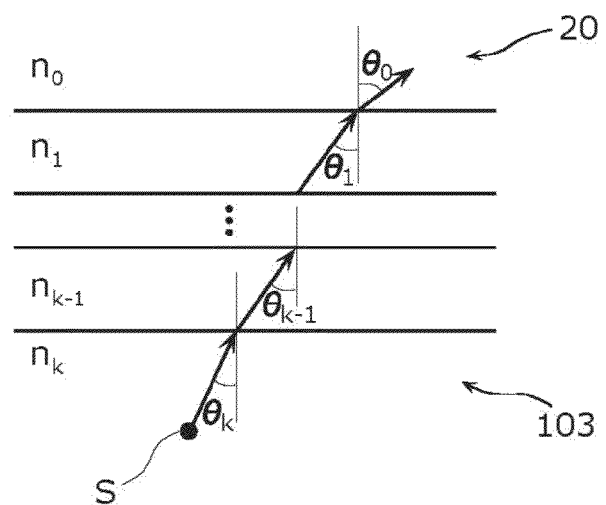

FIG. 20A illustrates how light propagates on an assumption that the transparent layer in the light-emitting device shown in FIG. 19 has the multi-layer structure.

Figure 20B:
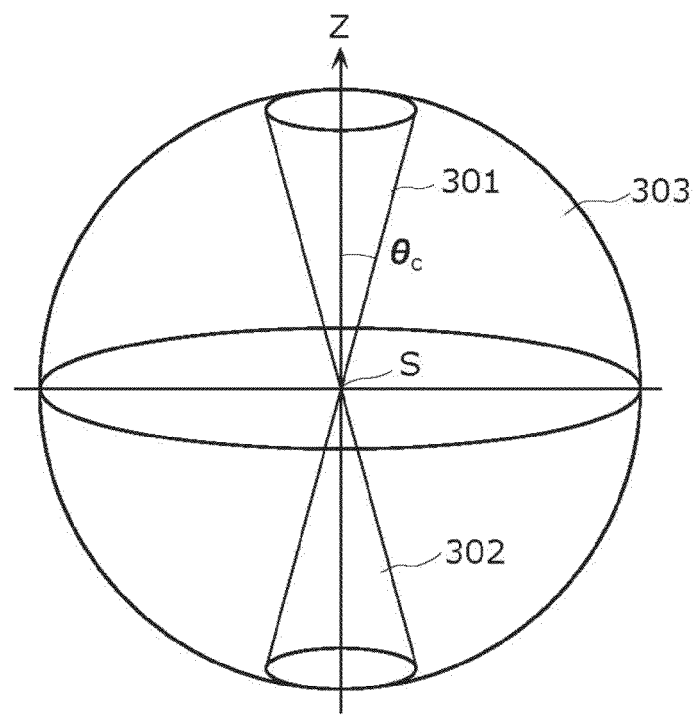

FIG. 20B schematically illustrates a range of light which can be extracted from the light-emitting layer in the light-emitting device shown in FIG. 19.

Figure 21:
Figure 21:
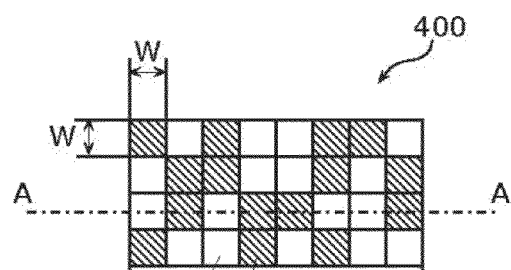
Figure 21:
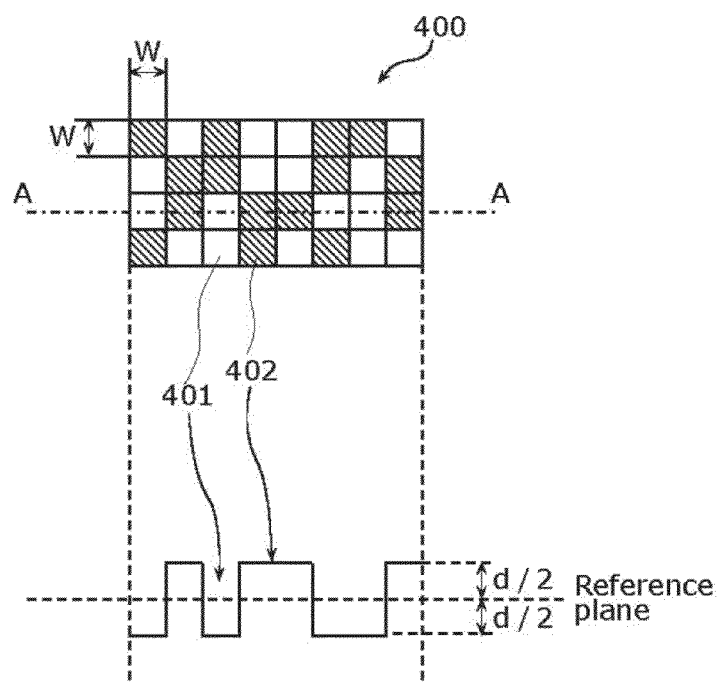

(a) in FIG. 21 illustrates patterns of the surface structure in the light extraction structure disclosed in Patent Literature 1. (b) in FIG. 21 is a partially enlarged view of the patterns illustrated in (a) in FIG. 21. (c) in FIG. 21 is a cross-sectional view taken along the line A-A in (b) in FIG. 21.

Figure 22:
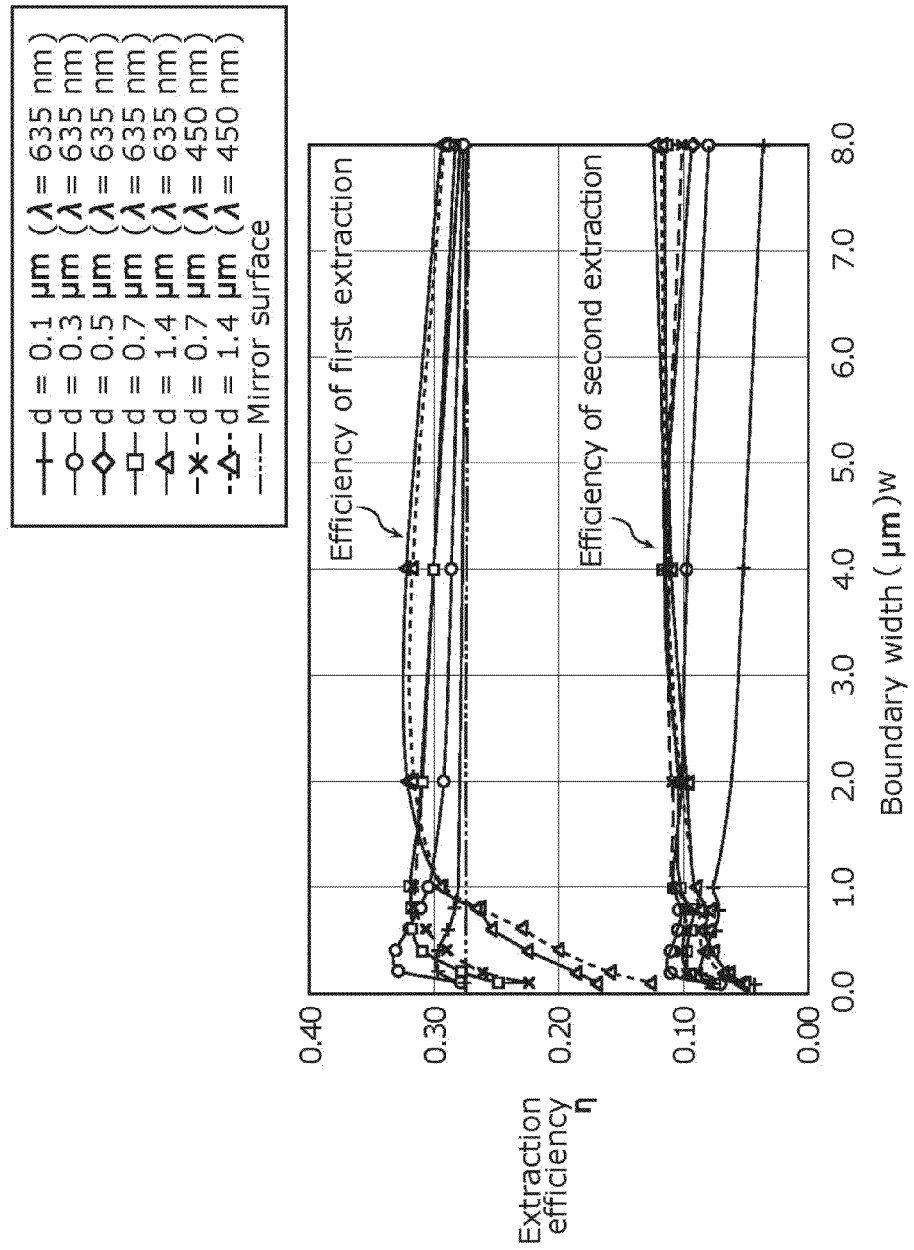

FIG. 22 illustrates the relationship between a boundary width and the light extraction efficiency η with respect to a depth d of a recess and projection structure in the light extraction structure disclosed in Patent Literature 1.

DESCRIPTION OF EMBODIMENTS (Underlying Knowledge Forming Basis of the Present Disclosure)

Before the description of the embodiments, the following problem will be explained with reference to FIG. 22. The problem is that when light absorption in the light-emitting device is taken into account in the light extraction structure disclosed in Patent Literature 1, total efficiency of a light-emitting device as a whole varies depending on a selected material or the configuration of an organic EL.

FIG. 22 illustrates the relationship between a boundary width and the light extraction efficiency η with respect to a depth d in the recess and projection structure in the light extraction structure disclosed in Patent Literature 1. In FIG. 22, among light beams (λ=635 nm, 450 nm) generated at a light-emitting point, light extraction efficiency obtained from light transmittance when light is incident on the recess and projection structure for the first time is called efficiency of first extraction, and light extraction efficiency obtained from light transmittance when the light is reflected by the recess and projection structure after the first extraction, reflected again in the light-emitting device (e.g., reflecting electrode), and is incident again on the recess and projection structure is called efficiency of second extraction. It should be noted that in FIG. 22, the long dashed double-dotted line represents extraction efficiency on a mirror surface.

As shown in FIG. 22, when the recess and projection structure is used, dependency between the boundary width w and the extraction efficiency can been seen in each depth d. However, the maximum efficiency of first extraction is around 1.1 times the extraction efficiency for the mirror surface. Meanwhile, without the recess and projection structure, the efficiency of second extraction on the mirror surface is zero (i.e., light incident at an angle greater than or equal to a critical angle will be never extracted). However, as shown in FIG. 22, effects of light extraction can be obtained also after the first reflection by using the recess and projection structure.

When the efficiency of first extraction using the recess and projection structure is equivalent to the light extraction efficiency on a mirror surface, most of all the optical extraction effects depend on efficiency after the first extraction.

This means that the recess and projection structure in the light extraction structure disclosed in Patent Literature 1 improves light extraction efficiency by multiple reflection.

However, in such a structure, when the light-emitting device has a structure absorbing a large amount of light or is made of materials absorbing a large amount of light, as a larger amount of light is contained in the light-emitting device, a larger amount of light is absorbed. Therefore, improvement of extraction efficiency by multiple reflection can not be expected. Moreover, there is a problem that total efficiency as the whole light-emitting device cannot be improved.

One non-limiting and exemplary embodiment improves the efficiency of first extraction and provides a sheet and a light-emitting device which are less likely to be subject to light absorption in the light-emitting device.

In an aspect of a sheet according to an exemplary embodiment disclosed herein, a sheet is used for a light-emitting device including a light-emitting layer. The sheet includes: a first layer including a plurality of projecting portions; and a second layer on the first layer, in which the projecting portions each include at least two steps, the second layer is formed on at least top surfaces of the steps, and when an effective refractive index of the first layer is $n_1$, an effective refractive index of the second layer is $n_2$, and a refractive index of the air above the second layer is $n_0$, a relationship $n_1 > n_2 > n_0$ is satisfied.

Moreover, in an aspect of a sheet according to an exemplary embodiment, each of the steps may have a height of 0.2 µm or more.

Moreover, in an aspect of a sheet according to an exemplary embodiment, the second layer may have a film thickness of 0.6 µm or less.

Moreover, in an aspect of a sheet according to an exemplary embodiment, the projecting portions may be periodically arranged.

Moreover, in an aspect of a sheet according to an exemplary embodiment, the projecting portions may be randomly arranged.

Moreover, in an aspect of a sheet according to an exemplary embodiment, the second layer may include an organic film or an inorganic film.

Moreover, in an aspect of a sheet according to an exemplary embodiment, the second layer may be also formed on side surfaces of the steps.

Moreover, an aspect of a light-emitting device according to an exemplary embodiment disclosed herein includes one of the sheets.

Moreover, in an aspect of a light-emitting device according to an exemplary embodiment, the first layer and the second layer may be provided in the order of the first layer and the second layer in a direction from the light-emitting layer toward the air.

Moreover, in an aspect of a light-emitting device according to an exemplary embodiment disclosed herein, a light-emitting device includes a light-emitting layer. The light-emitting device includes: a first layer including a plurality of projecting portions; a second layer on the first layer; and a third layer on the second layer, in which the projecting portions each include at least two steps, the second layer is formed on at least top surfaces of the steps, when an effective refractive index of the first layer is $n_1$, an effective refractive index of the second layer is $n_2$, and a refractive index of the third layer is $n_3$, a relationship $n_1 > n_2 > n_3$ is satisfied, and the first layer, the second layer, and the third layer are provided in the order of the first layer, the second layer, and the third layer in a direction from the light-emitting layer toward the air.

Moreover, in an aspect of a light-emitting device according to an exemplary embodiment, the second layer may have a film thickness of 0.6 µm or less.

Moreover, in an aspect of a light-emitting device according to an exemplary embodiment, the projecting portions may be periodically arranged.

Moreover, in an aspect of a light-emitting device according to an exemplary embodiment, the projecting portions may be randomly arranged.

Moreover, in an aspect of a light-emitting device according to an exemplary embodiment, the second layer may include an organic film or an inorganic film.

Moreover, in an aspect of a light-emitting device according to an exemplary embodiment, the second layer may be also formed on side surfaces of the steps.

Hereinafter, certain exemplary embodiments are described in greater detail with reference to the accompanying Drawings.

The following describes the exemplary embodiments with reference to the drawings. It should be noted that each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

Embodiment 1

Figure 1:
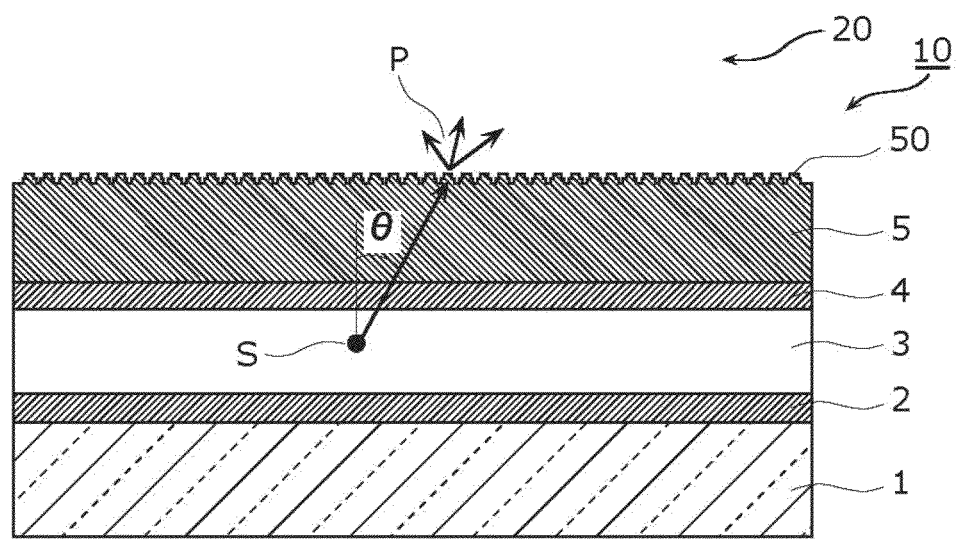
FIG. 1 illustrates a cross-sectional structure of a light-emitting device according to the first embodiment and how light propagates.

With reference to FIG. 1, the following describes an overall configuration of a light-emitting device 10 according to the first embodiment. FIG. 1 illustrates a cross-sectional structure of the light-emitting device according to the first embodiment and how light propagates.

As shown in FIG. 1, the light-emitting device 10 according to the present embodiment is a surface-emitting device that includes multiple layers including a surface-emitting layer. The light-emitting device 10 includes a substrate 1, a reflecting electrode 2 on the substrate 1, a light-emitting layer 3 on the reflecting electrode 2, a transparent electrode 4 on the light-emitting layer 3, and a transparent substrate 5 on the transparent electrode 4. In the present embodiment, an organic EL element (phosphor) includes the substrate 1, the reflecting electrode 2, the light-emitting layer 3, and the transparent electrode 4. It should be noted that an air layer (the air) 20 surrounds the light-emitting device 10, and the transparent substrate 5 is exposed to the air layer 20.

The substrate 1 is, for example, a glass substrate or a flexible transparent resin substrate. The reflecting electrode 2 is, for example, a reflexible metal electrode including Al or silver alloy APC. The light-emitting layer 3 is a surface-emitting layer including an organic EL layer made of one or more organic light-emitting materials. By application of a predetermined voltage between the reflecting electrode 2 and the transparent electrode 4, the organic light-emitting materials are excited and emit light. The refractive index of the light-emitting layer 3 can be, for example, around 1.75. The transparent electrode 4 is an electrode including a transparent metal oxide such as an indium tin oxide (ITO) or an indium zinc oxide (IZO). In the present embodiment, the transparent electrode 4 is formed using an ITO having a refractive index of 2.0. It should be noted that in addition to the light-emitting layer 3, a functional layer such as a hole injection layer, a hole transport layer, an electron injection layer, or an electron transport layer may be provided between the reflecting electrode 2 and the transparent electrode 4.

The transparent substrate 5 is a film optical sheet whose base substrate is a transparent resin substrate or a glass substrate, for example. The transparent substrate 5 includes a surface structure 50 including a step structure having minute recess and projection portions on the surface. The transparent substrate 5 is bonded to the transparent electrode 4 by an adhesive (not shown in FIG. 1).

By application of a predetermined voltage to the reflecting electrode 2 and the transparent electrode 4 in the light-emitting device 10 configured as above, the light-emitting layer 3 emits light. In this case, as shown in FIG. 1, the light generated at the luminous point S, for example, transmits through the transparent electrode 4, and is incident on a point P on the surface structure 50 of the transparent substrate 5 at an angle $\theta_1$ with respect to the plane normal to the surface of the transparent substrate 5. The light is then refracted and diffracted at this point P by the surface structure 50, and propagates toward the air layer 20.

With reference to FIG. 2, the following describes a detailed configuration of the surface structure 50 of the transparent substrate 5. FIG. 2 illustrates a surface structure of a transparent substrate in a light-emitting device according to the first embodiment. (a) in FIG. 2 is an enlarged plan view of the surface structure. (b) in FIG. 2 is a cross-sectional view taken along the line A-A in (a) in FIG. 2.

As shown in (a) and (b) in FIG. 2, the transparent substrate 5 includes a first layer 51 and a second layer 52 formed on the first layer 51.

As shown in (b) in FIG. 2, the first layer 51 includes a base 70 and projecting portions 60 formed on the base 70. The projecting portions 60 each have a step structure having at least two steps. In the present embodiment, the projecting portions 60 each have a two-step structure and include a first step 61 having a larger diameter and a second step 62 having a smaller diameter which is located on the first step 61. The diameter of the first step 61 is greater than that of the second step 62. The first layer 51 can be formed of one or more materials such as resin having a predetermined refractive index.

The second layer 52 is a thin film having a low refractive index and covers the entire surface of the first layer 51. This means that the second layer 52 is formed on the surfaces of the base 70 and the projecting portions 60. Specifically, the second layer 52 is formed on the side surfaces and top surfaces of the first step 61 and on the side surfaces and top surface of the second step 62. Moreover, the second layer 52 is formed on the surface of the base 70 between the projecting portions 60. It should be noted that as will be described later, the second layer 52 may be formed on at least the top surfaces (ceiling surfaces) of the first step 61 and the second step 62, i.e., at least the surface substantially parallel to the substrate surface (surface substantially perpendicular to the stacking direction) in each step. Moreover, the second layer 52 can be made of an organic film or an inorganic film. For example, the first layer 52 can be formed of one or more materials such as resin having a predetermined refractive index. In the present embodiment, the second layer 52 is the outermost surface layer of the transparent substrate 5, and is exposed to the air layer 20, i.e., the air.

In the transparent substrate 5 (surface structure 50) configured as above, when the refractive index (effective refractive index) of the first layer 51 is $n_1$, the refractive index (effective refractive index) of the second layer 52 is $n_2$, and the refractive index of the air layer 20 above the second layer 52 is $n_0$, the relationship $n_1 > n_2 > n_0$ is satisfied. It should be noted that the refractive index $n_1$ of the first layer 51 can be $1.21 \leq n_1 \leq 3.0$, and the refractive index $n_2$ of the second layer 52 can be $1.2 \leq n_2 \leq 2.9$.

It should be noted that in the present embodiment, the transparent substrate 5 is the uppermost layer in the light-emitting device 10, and the surface structure 50 is in contact with the air layer 20. However, in the light-emitting device 10 shown in FIG. 1, the surface structure 50 may be formed on any interfaces on which total reflection occurs. However, even if the surface structure 50 is formed on any layers, a refractive index difference of $n_1 > n_2 > n_0$ needs to be satisfied.

Moreover, in the present embodiment, the projecting portion 60 in the transparent substrate 5 has edges (corners) of steps in a rectangular shape in a cross section, and preferably, each step should have a height (length in the stacking direction) of 0.2 μm or greater. This means that when the height of the first step 61 is H1 and the height of the second step 62 is H2, H1≥0.2 μm and H2≥0.2 μm are preferable.

Moreover, in the present embodiment, when the a minimum processing width for the projecting portion 60 (the diameter of the top surface of the second step 62 in the present embodiment) is Wa, a minimum processing width of a recessed portion between the projecting portions 60 (distance between the projecting portions) is Wb, and a minimum processing width of each step (step width) is Wc, 0.2 μm≤Wa≤8.0 μm, 0.2 μm≤Wb≤8.0 μm, and 0.2 μm≤Wc≤8.0 μm are preferable.

Moreover, in the present embodiment, among refractive index interfaces with the first layer 51, the planes of the second layer 52 which are parallel to the main surface of the substrate 1 may have the refractive index $n_2$. It should be noted that in the second layer 52, the thickness (film thickness) in the direction perpendicular to the substrate (in the stacking direction) is t1 (>0), and the thickness in the direction parallel to the substrate (thickness of side surfaces) is t2 (≥0). In this case, it is preferable that the film thickness t1 be 0.6 μm or less for manufacturing requirements. Moreover, the second layer 52 formed on the side surfaces of the first step 61 and the second step 62 are not necessarily provided (That is, t2 may be 0). It should be noted that in the present embodiment, t1=t2.

Moreover, as shown in (a) in FIG. 2, the surface structure 50 in the present embodiment includes the first layer 51 having projecting portions 60 which are columnar fine structures arranged in a grid pattern and extend in the direction perpendicular to the substrate. However, as long as the height of each step is greater than or equal to 0.2 μm and the second layer 52 having a certain thickness t1 in the direction perpendicular to the substrate and the refractive index $n_2$ is formed, the shape of each of the projecting portions 60 may be a rectangular column (square pole). Moreover, the arrangement of projecting portions 60 in a plane view is not limited to the grid pattern, but may be other arrangements such as a triangle grid pattern. Moreover, although the projecting portions 60 have a periodic structure in which the projecting portions 60 are arranged periodically in the present embodiment, the projecting portions 60 may have a random structure in which the projecting portions 60 are arranged randomly. Other arrangements such as a ridge structure can be also used. Moreover, as long as the refractive index $n_2$ of the second layer 52 is an effective refractive index, the effective refractive index of the second layer 52 may be $n_2(n_1 > n_2 > n_0)$ by employing a fine structure such as a moth-eye structure for the arrangement.

The following describes improvement effects of light extraction efficiency for the transparent substrate 5 (surface structure 50) of the light-emitting device 10 according to the present embodiment and the background as to why the present disclosure has been conceived. It should be noted that in the present embodiment, the surface structure 50 may be formed on any layers in which total reflection occurs in the light-emitting device 10. However, here, for simplification, the following describes a case where the surface structure 50 is formed on the transparent substrate 5, i.e., on the interface with the air layer 20 as shown in FIG. 1.

In FIG. 1, assuming that the refractive index of the air layer 20 is $n_0$ and the refractive index of the transparent substrate 5 is $n_1$, and the surface structure 50 (projecting portions 60) is not provided (i.e., the surface of the transparent substrate is a flat surface), when the incidence angle θ of light incident from the light-emitting layer 3 onto the interface between the transparent substrate 5 and the air layer 20 becomes greater than the critical angle $\theta c = \sin^{-1}(n_0/n_1)$, total reflection occurs.

On the other hand, when the surface structure 50 (projecting portions 60) is provided on the surface of the transparent substrate 5, even if light is incident on the interface at an angle greater than or equal to the critical angle θ, energy for allowing the light to transmit without being totally reflected is generated on account of boundary diffraction effects. Therefore, some light beams emitted from the light-emitting layer 3 are transmitted through the transparent substrate 5 and outputted to the air layer 20 (first light extraction). Moreover, a part of energy incident on the surface structure 50 becomes light energy to be reflected in a random direction. The other light beams emitted from the light-emitting layer 3 are reflected in the surface structure 50 and are back to the light-emitting layer 3. After the reflected light beams are reflected in the reflecting electrode 2, the light beams are incident on the surface structure 50 again. In a similar way described above, some of the light beams are outputted to the air layer 20 (second light extraction) and the remaining light beams are reflected again. Light beams emitted from the light-emitting layer 3 repeat the above process almost infinitely.

Thus, when the surface structure 50 (projecting portions 60) is not provided on the transparent substrate 5, light extraction after the first extraction is zero due to the total reflection. Therefore, light extraction efficiency can be improved with respect to the light extraction efficiency on a mirror surface by forming the surface structure 50 (projecting portions 60) on the transparent substrate 5.

Here, when layers in the light-emitting device absorb a large amount of light, as reflection is repeated, an optical distance to a point where the light is extracted outside becomes longer. Thus, naturally, a larger amount of light is absorbed into the layers in the light-emitting device. Therefore, when a structure having a low efficiency of first light extraction such as the conventional light extraction structure shown in FIG. 21 is employed in a light-emitting device that absorbs a large amount of light, sufficient light extraction efficiency cannot be obtained. Therefore, to obtain similar effects in the light-emitting device that absorbs a large amount of light, it is necessary to design a structure so as to improve the efficiency of the first light extraction.

Here, with reference to FIGS. 3 to 5, the following describes a light extraction mechanism when in a surface structure having steps (projecting portions), light is incident on the steps at an incidence angle greater than or equal to a critical angle.

With reference to FIG. 3, the following describes electromagnetic wave analysis of a surface structure having steps. FIG. 3 illustrates the electromagnetic wave analysis when a step of a height H is provided for the medium A having a refractive index of 1.5. (a) in FIG. 3 is a schematic view of the electromagnetic wave analysis. (b) in FIG. 3 illustrates electric field contour showing a result of the electromagnetic wave analysis in (a) in FIG. 3.

As shown in (a) in FIG. 3, this analysis studied a case where plane waves are incident on a step at an incidence angle greater than or equal to a critical angle (45 degrees in FIG. 3), and light propagates from the medium A having a refractive index of 1.5 toward the medium B having a refractive index of 1.0. Moreover, (b) in FIG. 3 shows how the light propagates in this case, which was obtained by the electromagnetic field analysis. It should be noted that in (b) in FIG. 3, a white part represents an area having a high field strength, and a thick solid white line represents a boundary between the medium B and the surface structure (medium A) having a step.

As shown in (b) in FIG. 3, the result of this analysis shows that electromagnetic field concentration occurs on an area centering on the corner (edge) of the step and propagation light generates diagonally from the corner of the step. It is believed that this phenomenon occurs by the following mechanism. The following describes this mechanism with reference to FIG. 4.

(a) to (h) in FIG. 4 schematically show boundary conditions of an optical field on a refracting surface and assume a case where light having a width W is incident on a refracting surface T. It should be noted that from the Maxwell's equations, regarding an electric field vector or a magnetic field vector, integration (contour integration A) along a route A circling across the refracting surface T is zero. This is on preconditions that there is no charge or light source inside the circuit route and that the strength and phase of the electric field vector or the magnetic field vector along the refracting surface T are continuous.

When the width W of light is sufficiently wide as shown in (a) in FIG. 4, a width t perpendicular to the refracting surface T can be negligibly small as compared with a width s along the refracting surface T. In the contour integration, only the components along the refracting surface T remain. From this relationship, it is found that the electric field vector or the magnetic field vector is continuous across the refracting surface T. Using this relationship of continuity, the Fresnel equations are derived. By these equations, the law of reflection, the law of refraction, the phenomenon of total reflection and others are completely clarified.

When the width W of the light becomes less than or equal to several ten times the wavelength as shown in (b) in FIG. 4, the width t is no longer negligible. In this case, (c) in FIG. 4 shows a case where the route A is divided into routes B and C, and the contour integration A is divided into contour integration B and C. The contour integration B is contained in the luminous flux and thus becomes zero. As to the remaining contour integration C, only an integrated value of a route PQ in the luminous flux remains as shown in (d) in FIG. 4 since the electric field vector or the magnetic field vector outside the luminous flux is zero. Therefore, the contour integration C is no longer zero, and is, according to calculations, equivalent to light emission in the circuit route.

Furthermore, when the width W of the light is decreased to around 1/10 the wavelength, the contour integrations C and C' become closer to each other as shown in (e) in FIG. 4, and a route PQ and a route Q'P' coincide in location. Therefore, the total contour integration of the contour integrations C and C' becomes zero, and thus no light is emitted in the circuit route.

When the aligned light W and light W' having a phase difference of n are incident on the refracting surface T as shown in (f) in FIG. 4, the contour integration A across these luminous fluxes will be discussed.

Also in this case, when the width W of the light becomes less than or equal to several ten times the wavelength, the width t is no longer negligible. Here, when the contour integration A is divided into three parts: the contour integration B, the contour integration C, and the contour integration B' as shown in (g) in FIG. 4, the contour integration B and the contour integration B' are contained in the luminous fluxes, and thus become zero. Meanwhile, as to the remaining contour integration C, a component along the refracting surface T can be ignored, and as shown in (h) in FIG. 4, an integration value of the route PQ and the route Q'P' along the boundary between the two luminous fluxes remains. The integration at the route Q'P' in the field where the phase of a luminous flux is n is equal to the integration at the route PQ in the filed where the phase of a luminous flux is zero. Therefore, the contour integration C is twice the integration at the route PQ, and is, according to calculations, equivalent to light emission in the circuit route.

Thus, as shown in (a) to (h) in FIG. 4, not only in the case where light has a narrow width, but also in the case where light beams having narrow widths and different phases are aligned, light is generated near the boundary of the widths. It should be noted that in such a phenomenon, light is not actually emitted, but virtually the same behavior as light emission is seen. This phenomenon is similar to a phenomenon called the boundary diffraction advocated by Young before the establishment of the diffraction theory. Therefore, the phenomenon is called boundary diffraction effects.

As described above, whatever the incidence conditions on the refracting surface T are, when light is emitted on the refracting surface T, the light propagates toward both media between which the refracting surface T exists. In other words, even when light is incident at an incidence angle greater than or equal to a critical angle, if light emission is, according to calculations, considered to be generated on the refracting surface T, it is believed that the light is not totally reflected but is transmitted.

Here, FIG. 5 illustrates electric field vectors at the corner of the step in a step structure. As shown in (a) in FIG. 5, considering the contour integration of electric field vectors in the side and top surfaces of the step in a similar way to FIG. 4, the electric field vectors remain only in the components parallel to the planes of a refractive index boundary as shown in (a) in FIG. 5. The electric field vectors remained in the top and the side surfaces of the step then gather at the corner of the step, and the corner of the step behaves like a light source. Thus, as shown in (c) in FIG. 5, it is believed that the light from the step toward the outside diagonally propagates from an area centering on the corner of the step as radiation light.

As described with reference to FIGS. 3 to 5, it is understood that even if light is incident at an incidence angle greater than or equal to a critical angle, the light can be extracted in a surface structure having steps (projecting portions).

Regarding the surface structure having steps, the following describes that light extraction efficiency varies according to the height of the surface structure and the number of steps. FIG. 6 illustrates a surface structure having a total height H of a step or steps. (a) in FIG. 6 is an enlarged cross-sectional view of a light-emitting device including a transparent substrate of a surface structure in which one step is provided according to the first comparative example. (b) in FIG. 6 is an enlarged cross-sectional view of a light-emitting device including a transparent substrate of a surface structure in which two steps are provided according to the present embodiment. It should be noted that a surface structure 550 having one step as shown in (a) in FIG. 6 is called single level. The surface structure 50 having two or more steps as shown in (b) in FIG. 6 is called multilevel. Moreover, FIG. 7 shows dependence of transmittance on the height H when the thickness of the second layer 52 is zero in (a) and (b) in FIG. 6 and when plane waves having power 1 are incident on the transparent substrate 5 of the surface structure 50 and a transparent substrate 505 of the surface structure 550 at an incidence angle greater than or equal to a critical angle. (a) in FIG. 7 shows dependence of transmittance on the height H in the case of the single level. (b) in FIG. 7 shows dependence of transmittance on the height H in the case of the multilevel. It should be noted that FIG. 7 shows the case where in FIG. 6, the refractive index $n_1$ of the first layer 51 is 1.5, the refractive index $n_0$ of an air layer is 1.0, and the incidence angle θ of a parallel wave (λ=555 nm) is 45 degrees and 60 degrees. Moreover, Wc=0.6 μm in (b) in FIG. 6.

As shown in (a) and (b) in FIG. 7, the transmittance of light incident at an incidence angle greater than or equal to a critical angle increases (i) as the height H of the surface structure 550 (transparent substrate 505) of the single level increases and (ii) as the height H of the surface structure 50 (transparent substrate 5) of the multilevel increases. In other words, it is clear that as the height of a surface structure increases, light extraction efficiency improves. The following analyzes improvement effects of transmittance with respect to the height H of a surface structure.

In a constitutive equation representing electromagnetic characteristics when a light component closer to the substrate direction among propagated light components propagates into a substance again, when polarization is P, an electric field is E, and a dielectric constant in a vacuum is $\in_0$, an elastic flux density D in a non-magnetic medium is expressed by the following expression.

$$D = \in_0 E + P$$

Moreover, when the relationship between the polarization P and the electric field E can be expressed in a linear relationship, the elastic flux density D can be described by the following three relational expressions, using a dielectric constant $\in$ and an electric susceptibility $X_E$.

$$D = \in \in_0 E$$

$$\in = 1 + X_E$$

$$P = \in_0 X_E E$$

Moreover, the dielectric constant $\in$ is associated with a refractive index n in the following expression.

$$\in = n^2$$

Here, when the electric field E is present, the polarization P has a physical meaning that light is induced. Therefore, the above expression shows that a high refractive index n means a large polarization P. In other words, it is understood that light beams tend to gather at a portion in which the refractive index n is high.

Thus, in a surface structure having steps, the low height of a step or proximity between the corners (edges) of steps creates a high refractive index area having a high polarization near the corner of a step in which propagation light is generated. Then, light extracted from the step is pulled back to the step and light extraction efficiency is reduced. Therefore, to improve the light extraction efficiency, it is necessary to reduce polarization as much as possible.

To reduce the polarization and improve the light extraction efficiency, there are two possible methods as shown in FIG. 7: (i) a method of moving the high refractive index area away from the vicinity of the corners of steps by increasing the height H of a surface structure and (ii) a method of introducing a surface structure which can be effectively considered to have a low refractive index.

The inventor of the present application considered (i) a way of reducing polarization near the corner of a step by introducing the surface structure which can be effectively considered to have a low refractive index, and (ii) forming, on the surface of the step, a thin film having a refractive index lower than that of the step. The following describes the results with reference to FIG. 6 again.

As shown in (a) and (b) in FIG. 6, the case where the surface of the first layer 51 having a step or steps is covered with the second layer 52 having a low refractive index will be considered. At this time, FIG. 8 shows transmittance when parallel waves are traveling from the first layer 51 toward the air layer at an incidence angle greater than or equal to a critical angle. The graphs in FIG. 8 each illustrate dependence of transmittance on a film thickness t1 of the second layer 52. Moreover, the left graph in FIG. 8 illustrates the transmittance of a light-emitting device (single level+second layer) according to the first comparative example shown in (a) in FIG. 6. The right graph in FIG. 8 illustrates the transmittance of a light-emitting device (multilevel+second layer) according to the present embodiment shown in (b) in FIG. 6. Moreover, the graphs shown in FIG. 8 each illustrate transmittance when the incidence angle θ of a parallel wave (λ=555 nm) is 45 degrees and 60 degrees with respect to the structures having different heights H. Moreover, in FIG. 8, $n_1$=1.51, $n_2$=1.34, $n_0$=1.0, and Wc=0.6 μm.

It is understood from FIG. 8 that when the incidence angle θ is 45 degrees, as the film thickness t1 of the second layer 52 increases, the transmittance improves both in the light-emitting device according to the first comparative example (single level) and the light-emitting device according to the present embodiment (multilevel).

Meanwhile, from the transmittance in the case of an incidence angle θ of 60 degrees, it is understood that even if the film thickness t1 of the second layer 52 increases, not much increase in the transmittance can be expected in the light-emitting device according to the first comparative example (single level). On the other hand, in the light-emitting device according to the present embodiment (multilevel), it is understood that when the surface structure has a height H of 1.2 μm or more, increase in the transmittance can be seen by adding the second layer 52. Therefore, it is understood that when the surface structure includes projecting portions having more than one step (multilevel) and the second layer 52 is formed on the projecting portions, it is possible to transform incident light incident at a wider angle into propagation light. This is probably because the number of edges (corners of steps) in which propagation light is generated is increased by employing the step structure having more than one step for the projecting portions 60, and because polarization in the vicinity of the edges is reduced by geometric arrangement of the projecting portions 60.

As mentioned above, the transparent substrate 5 (surface structure 50) in the light-emitting device 10 according to the present embodiment includes the first layer 51 having the projecting portions 60 each formed of at least two steps and the second layer 52 formed on the first layer 51. According to this configuration, incident light can be efficiently transformed into propagation light at the steps even when light is incident from the light-emitting layer 3 onto transparent substrate 5 at an incidence angle θ greater than or equal to a critical angle. Therefore, light extraction efficiency can be improved.

With reference to FIGS. 9 and 10, the following describes effects of the second layer 52 on polarization in the vicinity of the corners (edges) of the steps in the projecting portions 60.

FIG. 9 illustrates three cases in which the second layer 52 is formed on different places in a surface structure in which the second layer 52 is formed on the steps (multilevel) of the projecting portions 60 of the first layer 51. (a) in FIG. 9 is an enlarged cross-sectional view of a surface structure in a light-emitting device according to the first embodiment shown in FIG. 2, (b) in FIG. 9 is an enlarged cross-sectional view of a surface structure in a light-emitting device according to the modification of the first embodiment. (c) in FIG. 9 is an enlarged cross-sectional view of a surface structure in a light-emitting device according to the second comparative example.

As shown in (a) in FIG. 9, in the surface structure 50 (transparent substrate 5) of the light-emitting device 10 according to the first embodiment, the second layer 52 is formed over the entire surface of the steps of the first layer 51. In other words, the second layer 52 covers the entirety of the first layer 51. This means that the second layer 52 is formed on the top and side surfaces of the first step 61 and on the top and side surfaces of the second step 62.

Moreover, as shown in (b) in FIG. 9, the second layer 52 is formed only on the top surfaces of the steps of the first layer 51, in the surface structure 50A (transparent substrate 5A) of a light-emitting device according to the modification of the first embodiment. In other words, the second layer 52 according to the present modification is formed on the top surfaces of the first step 61 and the second step 62, but not formed on the side surfaces of the first step 61 and the second step 62.

Moreover, as shown in (c) in FIG. 9, in a surface structure 650 (transparent substrate 605) of the second comparative example, the second layer 52 is formed only on the side surfaces of the steps of the first layer 51. In other words, the second layer 52 according to this comparative example is formed on the side surfaces of the first step 61 and the second step 62, but not formed on the top surfaces of the first step 61 and the second step 62.

With reference to FIG. 10, the following describes the relationship between transmittance and an incidence angle θ in each of the three cases in which the second layer 52 is formed on different places. Here, the three cases are shown in (a) to (c) in FIG. 9. The figures shown in FIG. 10 each illustrate a comparison of dependence of transmittance with respect to the incidence angle θ on the film thickness of the second layer in the three cases. (a) in FIG. 10 illustrates transmittance characteristics when the incidence angle θ is 30 degrees. (b) in FIG. 10 illustrates transmittance characteristics when the incidence angle θ is 45 degrees. (c) in FIG. 10 illustrates transmittance characteristics when the incidence angle θ is 60 degrees. It should be noted that in FIG. 10, the transmittance is calculated on the condition that $n_1$=1.51, $n_2$=1.34, $n_0$=1.0, H=1.0 μm, Wc=0.4 μm, and the film thickness t1 of the second layer 52 is a variable. Moreover, light incident from the light-emitting layer 3 onto the first layer 51 is a parallel wave (λ=555 nm).

As is clear from (a) to (c) in FIG. 10, when the second layer 52 is not formed on the top surfaces of the steps of the first layer 51, even if the film thickness t1 of the second layer 52 increases, the transmittance does not improve. On the other hand, when the second layer 52 is formed on the tops surfaces of the steps of the first layer 51, the transmittance improves. Moreover, in this case, when the second layer 52 is also formed on the side surfaces of the steps of the projecting portion 60, the transmittance further improves. Thus, (a) to (c) in FIG. 10 show that phenomenon that the transmittance changes according to the places on which the second layer 52 is formed in the steps is caused by different effects from the effects obtained by adding the second layer 52 (low reflecting coating) in the comparison of FIGS. 7 and 8.

With reference to FIG. 11, the following describes the relationship between the transmittance and the length of the top surface of the second step 62 (uppermost step) in the projecting portion 60 of the first layer 51, in the surface structure 50 (transparent substrate 5) of the light-emitting device 10 according to the present embodiment. (a) in FIG. 11 is an enlarged cross-sectional view of a projecting portion and its vicinity in the surface structure of a light-emitting device according to the present embodiment. (b) in FIG. 11 illustrates dependence of transmittance on Wa in the surface structure of the light-emitting device according to the present embodiment. It should be noted that (b) in FIG. 11 illustrates the comparison of the transmittance when a parallel wave (λ=555 nm) is incident at an incidence angle of 45 degrees and the transmittance when the parallel wave is incident at an incidence angle of 60 degrees, on the condition that a parameter is a minimum processing width (diameter of top surface of second step 62) Wa in the projecting portion 60, Wc=0.6 μm, H=1.2 μm, t1=0.2 μm, $n_1$=1.51, $n_2$=1.34, and $n_0$=1.0.

As is clear from (b) in FIG. 11, when Wa is smaller than 1 μm, the transmittance is low both when θ=45 degrees and when θ=60 degrees. As Wa increases, the transmittance improves. This is probably because when the incidence angle θ is increased, light incident on the corners (edges) of the steps can be incident without being blocked by the structure itself.

With reference to FIG. 12, the following describes the relationship between transmittance and a distance between steps (edges) in the projecting portion 60 of the first layer 51, in the surface structure 50 (transparent substrate 5) of the light-emitting device 10 according to the present embodiment. (a) in FIG. 12 is an enlarged cross-sectional view of a recessed portion (between projecting portions) and its vicinity in the surface structure of a light-emitting device according to the present embodiment. (b) in FIG. 12 illustrates dependence of transmittance on Wb in the surface structure of the light-emitting device according to the present embodiment. It should be noted that (b) in FIG. 12 illustrates the comparison of the transmittance when a parallel wave (λ=555 nm) is incident at an incidence angle θ of 45 degrees and the transmittance when the parallel wave is incident at an incidence angle of 60 degrees on the condition that a parameter is a minimum processing width Wb between the projecting portions 60 (a recessed portion) and that Wc=0.6 µm, H=1.2 µm, t1=0.2 µm, $n_1$=1.51, $n_2$=1.34, and $n_0$=1.0 in the same way as (b) in FIG. 11.

It is understood from (b) in FIG. 12 that the transmittance improves depending on the size of the width Wb of a recessed portion. This is probably because propagation light generated from the corners (edges) of the steps is not taken into a high refractive index area again by increasing Wb.

From the findings, it is understood that when there is less polarization near the corners of the steps and light is incident on the corners, the efficiency of first extraction can be improved using a surface structure having projecting portions (multilevel) that is a step structure formed of more than one step.

Here, with reference to FIG. 13, the following describes the efficiency of first extraction when the surface structure (single level) according to the first comparative example shown in (a) in FIG. 6 and the surface structure (multilevel) according to the present embodiment shown in (b) in FIG. 6 are respectively periodic lattice arrangements. It should be noted that FIG. 13 illustrates the efficiency of first extraction calculated on the condition that the height H of the surface structure is 1.0 µm both in the single level and multilevel. In this case, in the single level, the width W of each of the projecting portions is 2.0 µm and a pitch between the projecting portions is 2.6 µm while in the multilevel, Wa=0.8 µm, Wb=0.6 µm, and Wc=0.6 µm. It should be noted that the efficiency of first extraction is calculated on the condition that the thickness t1 of the second layer 52 is 0.16 µm, the refractive index $n_1$ of the first layer 51 is 1.51, the refractive index $n_2$ of the second layer 52 is 1.34, and the refractive index $n_0$ of the air layer 20 is 1.0.

As is clear from the result shown in FIG. 13, the efficiency of first extraction can be significantly improved in a multilevel structure to which the second layer 52 was added.

Here, with reference to FIG. 14, the following describes the relationship between the efficiency of first extraction and the height H of each step in the multilevel structure (without the second layer). It should be noted that in FIG. 14, $n_1$=1.51, $n_0$=1.0, Wa=2.3 µm, Wb=0.05 µm, and Wc=0.6 µm.

As shown in FIG. 14, when each step has a height H of 0.05 µm or greater, the efficiency of first extraction improves when compared to the case where no step is provided. Furthermore, as FIG. 14 shows, since the rate of change in the efficiency of first extraction improves from the height H of 0.2 µm, it is preferable that the height H of each step be 0.2 µm or greater.

Moreover, with reference to FIG. 15, the following describes effects of the full width (Wa+2×Wc) and a step width Wc of the projecting portion 60 on the efficiency of first extraction in a surface structure (multilevel) of a light-emitting device according to the present embodiment shown in FIG. 2. It should be noted that FIG. 15 illustrates the efficiency of first extraction calculated on the condition that H1=H2=0.6 µm, Wa=1.4 µm, Wb=0.6 µm, $n_1$=1.51, $n_2$=1.34, and $n_0$=1.0. Moreover, the film thickness t1 of the second layer 52 is fixed at 0.16 µm.

It is understood from FIG. 15 that the efficiency of first extraction can be significantly improved by increasing the full width (Wa+2×Wc) of the projecting portion 60. It is also understood that the efficiency of first extraction can be improved more significantly by increasing the step width Wc.

Moreover, with reference to FIG. 16, the following describes the efficiency of first extraction when the film thickness t1 and the refractive index $n_2$ of the second layer 52 are used as parameters, in a surface structure (multilevel) of a light-emitting device according to the present embodiment shown in FIG. 2. It should be noted that FIG. 16 illustrates the efficiency of first extraction calculated on the condition that H1=0.6 µm, H2=0.6 µm, Wa=2.2 µm, Wb=0.6 µm, Wc=0.4 µm, $n_1$=1.51, and $n_0$=1.0.

It is understood from FIG. 16 that as the film thickness t1 of the second layer 52 increases, the efficiency of first extraction improves. Moreover, it is clear that the efficiency of first extraction indicates a maximum value when the refractive index $n_2$ ranges from around 1.34 to around 1.37, and first extraction more than 1.5 times the extraction on a mirror surface can be obtained.

Thus, according to the light-emitting device 10 of the first embodiment, the transparent substrate 5 used for the light-emitting device 10 includes (i) the first layer 51 (refractive index $n_1$) on the surface of which the projecting portions 60 each having more than one step (multilevel) are formed and (ii) the second layer 52 (refractive index $n_2$) formed on at least the top surfaces of the steps, and the relationship $n_1 > n_2 > n_0$ is satisfied. This allows efficient extraction (first extraction) of light beams incident at an incidence angle greater than or equal to a critical angle, among light beams incident from the light-emitting layer 3 onto the transparent substrate 5. Therefore, even if a light-emitting device has a structure absorbing a large amount of light or is formed of materials absorbing a large amount of light, light extraction efficiency can be improved. Therefore, not only the total luminous flux and luminance of the light-emitting device can be improved, but also power consumption can be reduced and the life of elements can be extended.

Moreover, in the present embodiment, the second layer 52 may be formed on the entire surface (both on the top and side surfaces) of the steps of the projecting portion 60 of the first layer 51 as shown in (a) in FIG. 9, or the second layer 52 may be formed only on the top surfaces of the steps of the projecting portion 60 of the first layer 51 as shown in (b) in FIG. 9.

It should be noted that according to the configuration of (a) in FIG. 9, not only transmittance can be improved when an incidence angle is a wider angle as shown in FIG. 10, but also the second layer 52 can be easily formed on the first layer 51 of a recess and projection structure. Moreover, the configuration of (b) in FIG. 9 is more suitable for moth-eye structures than the configuration of (a) in FIG. 9.

Example

The following describes an example of an optical sheet used for the light-emitting device according to the first embodiment. The surface structure of an optical sheet used for the light-emitting device 10 according to the present embodiment as shown in FIG. 2 can be fabricated as follows.

Lithography and etching are performed on $SiO_2$ to form a mold on which the reversal patterns of the first layer 51 shown in (b) in FIG. 2 are formed. Then, release processing is performed on the mold, and the structure of the first layer 51 is copied onto a sheet base material using UV nanoimprint. Thus, the first layer 51 having the projecting portions 60 can be made.

Here, as a sheet base material, a PET film (COSMOSHINE (registered trademark)) made by TOYOBO Co., LTD can be used, for example. Moreover, as a resin for UV nanoimprint, PAK02 made by Toyo Gosei CO. Ltd can be used, for example.

It should be noted that a method of forming the step structure of the first layer 51 is not limited to UV nanoimprint, but the thermal imprint method, the injection molding method, or the sol-gel imprinting method may be used. Materials suitable for each production method may be used.

The second layer 52 can be formed on the surface of the first layer 51 by applying a resin having a low refractive index such as fluorocarbon resin to the surface of the formed first layer 51 without changing the film thickness.

At this time, as a fluorocarbon resin, the amorphous fluorocarbon resin (CYTOP) made by Asahi Glass Co., Ltd, can be used, for example. Moreover, a formation method of the second layer is not limited to a method of applying a resin having a low refractive index, but a film may be formed by vacuum process such as the chemical vapor deposition (CVD) and the physical vapor deposition (PVD), or may be formed by application by the sol-gel method or the liquid phase deposition (LPD) method. It should be noted that as long as a portion corresponding to the second layer 52 has an effective refractive index equivalent to that of the second layer 52, a microstructure such as the moth-eye structure may be formed instead of the second layer 52, for example.

Thus, an optical sheet can be fabricated which has the surface structure 50 including the first layer 51 on which the projecting portions 60 having steps are formed and the second layer 52 formed on the first layer 51. It should be noted that the formed optical sheet may be, for example, used as a transparent substrate itself in a light-emitting device as same as the present embodiment, and directly attached on the transparent electrode 4 with adhesive or attached on a planar transparent substrate provided on the uppermost surface of the light-emitting device with adhesive.

It should be noted that the recess and projection structure of the first layer 51 of the transparent substrate 5 is copied onto the sheet substrate using a mold, but a formation method of the recess and projection structure is not limited to this. For example, the first layer 51 having the recess and projection structure can be made by performing fine processing such as etching directly on the surface of a planar transparent substrate.

Embodiment 2

With reference to FIG. 17, the following describes a light-emitting device according to the second embodiment. (a) in FIG. 17 is an enlarged cross-sectional view of the light-emitting device according to the second embodiment. (b) in FIG. 17 illustrates the relationship between the efficiency of first extraction and the full width (Wa+2×Wc) of one projecting portion and the relationship between the efficiency of first extraction and the step width Wc (all the steps have the same width) of one projecting portion, in the surface structure of the light-emitting device shown in (a) in FIG. 17. It should be noted that in FIG. 17, the same reference numerals are given to the same structural elements as those shown in FIG. 2, and detailed explanation will be omitted here.

As shown in (a) in FIG. 17, a projecting portion of the first layer has three steps in a surface structure 50B (transparent substrate 5B) of a light-emitting device according to the present embodiment. This is different from the transparent substrate 5 of the light-emitting device 10 according to the first embodiment in which a projecting portion of the first layer has two steps. It should be noted that the surface structure 50B of the light-emitting device according to the present embodiment is multilevel having more than one step as same as the first embodiment.

The surface structure 50B (transparent substrate 5B) in the present embodiment includes a first layer 51BB and the second layer 52 formed on the first layer 51B. The first layer 51B includes projecting portions 60B provided on the base 70 and each of the projecting portions 60B has a three-step structure. In other words, the projecting portions 60B according to the present embodiment includes the first step 61 having a large diameter, the second step 62 located on the first step 61 and having a medium size diameter, and a third step 63 located on the second step 62 and having a small diameter.

It should be noted that although the second layer 52 covers the entire surface of the first layer 51, the second layer 52 may be formed on at least each top surface of the first step 61, the second step 62, and the third step 63, and the second layer 52 does not necessarily have to be formed on the side surfaces of each step. This is as same as the first embodiment. Moreover, also in the present embodiment, the effective refractive index $n_1$ of the first layer 51, the effective refractive index $n_2$ of the second layer 52, and the refractive index $n_0$ of the air layer 20 satisfy the relationship $n_1 > n_2 > n_0$. Moreover, in the light-emitting device, the surface structure 50B may be formed on any interfaces on which total reflection occurs, also in the present embodiment.

Moreover, (b) in FIG. 17 illustrates the efficiency of first extraction calculated on the condition that an overall height H of the projecting portion 60B is 1.2 μm (H1=H2=H3=0.4 μm), Wa=0.1 to 3.3 μm, Wb=0.6 μm, $n_1$=1.51, $n_2$=1.34, $n_0$=1.0, and t1=0.16 μm, and the full width (Wa+2×Wc) and the step width Wc (all the steps have the same width) of the projecting portion 60B are parameters.

As a result, it is understood from (b) in FIG. 17 that when the full width of the projecting portion 60B (Wa+2×Wc) is around 2.0 μm or greater, the efficiency of first extraction improves. Moreover, when Wc=0.3 to 0.4 μm and the full width of the projecting portion 60B (Wa+2×Wc) exceeds around 2.8 μm, the efficiency of first extraction significantly improves. Moreover, as is clear from comparison with FIG. 15, higher efficiency of first extraction than that of the two-step structure can be obtained.

The light-emitting device according to the second embodiment includes the transparent substrate 5B of the surface structure 50B having three steps. Therefore, the light-emitting device according to the second embodiment can extract the first light incident at an incidence angle greater than or equal to a critical angle more efficiently than the light-emitting device 10 according to the first embodiment.

It should be noted that the transparent substrate 5B (surface structure 508) of the light-emitting device according to the present embodiment can be made by a process same as the example of the first embodiment and made of materials same as the example of the first embodiment.

Embodiment 3

With reference to FIG. 18, the following describes a light-emitting device 10C according to the third embodiment. (a) in FIG. 18 is a cross-sectional view of the light-emitting device according to the third embodiment. (b) in FIG. 18 is an enlarged view of the surface structure and its vicinity of the light-emitting device shown in (a) in FIG. 18. It should be noted that in FIG. 18, the same reference numerals are given to the same structural elements as those shown in FIGS. 1 and 2, and detailed explanation will be omitted here.

As shown in (a) in FIG. 18, a step structure having projecting portions each formed of two or more steps is formed in the light-emitting device 10C according to the present embodiment. This is different from light-emitting device according to the first embodiment in which a step structure is formed as the surface structure. It should be noted that the surface structure of the light-emitting device according to the present embodiment also has more than one step, and thus it is multilevel.

As shown in (a) and (b) in FIG. 18, the light-emitting device 10C according to the present embodiment includes a first layer 51C (transparent electrode 4C) having projecting portions 60C, a second layer 52C that is a low refractive index film and is formed on the first layer 51C (transparent electrode 4C), and a third layer 53C (transparent substrate 5C) formed on the second layer 52C.

The first layer 51C corresponds to the transparent electrode 4C, and includes a base 70C and projecting portions 60C formed on the base 70C. Moreover, each of the projecting portions 60C has a two-step structure and includes a first step 61C having a larger diameter and a second step 62C located on the first step 61C and having a smaller diameter.

For example, a transparent metal oxide such as ITO or IZO can be used for the material of the transparent electrode 4C as the first layer 51C, along with the material of the transparent electrode 4C according to the first embodiment. In the present embodiment, the transparent electrode 4C is formed using ITO having a refractive index of 2.0. Moreover, the recess and projection structure of the first layer 51C (transparent electrode 4C) can be patterned by etching, for example.

The second layer 52C covers the entire surface of the first layer 51C. This means that the second layer 52C is formed on the side and top surfaces of the first step 61C of the first layer 51C, the side surfaces and top surface of the second step 62C, and the surface of the base 70C between the projecting portions 60C. It should be noted that the second layer 52C can be formed of a material same as or similar to the material used for the second layer 52 in the first embodiment. The second layer 52C can be formed of an organic or inorganic film. Moreover, the second layer 52C may be formed on at least the top surfaces of the steps of the projecting portion 60C of the first layer 51C.

The third layer 53C corresponds to the transparent substrate 5C, and covers the entire surface of the second layer 52C of the recess and projection structure. The third layer 53C can be formed by applying a transparent resin or others having a predetermined refractive index to the surface of the second layer 52C, for example.

Thus, a step structure 50C including the first layer 51C, the second layer 52C, and the third layer 53C satisfies the relationship $n_1 > n_2 > n_3$, on the condition that the effective refractive index of the first layer 51C is $n_1$, the effective refractive index of the second layer 52C is $n_2$, and the effective refractive index of the third layer 53C is $n_3$.

Thus, the step structure 50C configured as above is formed in the light-emitting device 10C according to the third embodiment. Therefore, the light-emitting device 10C can obtain effects similar to those shown in the first embodiment, and efficiently extract the first light incident at an incidence angle greater than or equal to a critical angle.

It should be noted that although the step structure 50C is formed on the interface between the transparent electrode 4C and the transparent substrate 5C in the present embodiment, the step structure 50C may be formed on any interfaces on which total reflection occurs in the light-emitting device 10C. However, no matter which layer the step structure 50C is formed on, it is necessary that the first layer 51C and the third layer 53C sandwiching the second layer 52C satisfy the refractive index difference $n_1 > n_2 > n_3$.

Moreover, also in the present embodiment, it is preferable that the film thickness t1 of the second layer 52C be 0.6 or less.

Moreover, also in the present embodiment, the projecting portions 60C in the step structure 50C can be lattice arrangement or triangular lattice arrangement, for example. The projecting portions 60C can have a periodic structure, a random structure, a ridge structure or others.

The light-emitting devices and sheets according to the present disclosure are described based on the embodiments and modification. However, the present disclosure is not limited to the embodiments and modification.

For example, a transparent substrate is used as a sheet in the first and second embodiments. However, other materials may be used for the sheet. A sheet on which a surface structure having a step structure is formed may be prepared separately from a planar transparent substrate, and the separately prepared sheet may be attached on the planar transparent substrate attached on a transparent electrode.

Although only some exemplary embodiments of the present disclosure have been described in detail above, those skilled in the art will readily appreciate that many modifications are possible in the exemplary embodiments without materially departing from the novel teachings and advantages of the present disclosure.

The herein disclosed subject matter is to be considered descriptive and illustrative only, and the appended Claims are of a scope intended to cover and encompass not only the particular embodiments disclosed, but also equivalent structures, methods, and/or uses.

INDUSTRIAL APPLICABILITY

Sheets and light-emitting devices according to one or more exemplary embodiments disclosed herein are widely applicable to lighting systems or displays, for example. In particular, light extraction efficiency can be improved according to the sheets of one or more exemplary embodiments disclosed herein. Therefore, the sheets can be useful as display sheets using organic EL elements, sheets for lighting using organic EL elements, or sheets for LEDs. Thus, the sheets according to one or more exemplary embodiments disclosed herein are widely applicable to various light sources and phosphors for improving luminance.

The invention claimed is:

1. A sheet for use in a light-emitting device including a light-emitting layer, the sheet comprising:
    a first layer including a plurality of projecting portions; and
    a second layer on the first layer,
    wherein the projecting portions each include at least two steps,
    the second layer is formed on at least top surfaces of the steps, and
    when an effective refractive index of the first layer is $n_1$, an effective refractive index, of the second layer is $n_2$, and a refractive index of the air above the second layer is $n_0$, a relationship $n_1 > n_2 > n_0$ is satisfied.

2. The sheet according to claim 1,
wherein each of the steps has a height of 0.2 μm or more.

3. The sheet according to claim 1,
wherein the second layer has a film thickness of 0.6 μm or less.

4. The sheet according to claim 1,
wherein the projecting portions are periodically arranged.

5. The sheet according to claim 1,
wherein the projecting portions are randomly arranged.

6. The sheet according to claim 1,
wherein the second layer comprises an organic film or an inorganic film.

7. The sheet according to claim 1,
wherein the second layer is also formed on side surfaces of the steps.

8. A light-emitting device comprising the sheet according to claim 1.

9. The light-emitting device according to claim 8,
wherein the first layer and the second layer are provided in the order of the first layer and the second layer in a direction from the light-emitting layer toward the air.

10. A light-emitting device including a light-emitting layer, the light-emitting device comprising:
a first layer including a plurality of projecting portions;
a second layer on the first layer; and
a third layer on the second layer,
wherein the projecting portions each include at least two steps,
the second layer is formed on at least top surfaces of the steps,
when an effective refractive index of the first layer is $n_1$, an effective refractive index of the second layer is $n_2$, and a refractive index of the third layer is $n_3$, a relationship $n_1 > n_2 > n_3$ is satisfied, and
the first layer, the second layer, and the third layer are provided in the order of the first layer, the second layer, and the third layer in a direction from the light-emitting layer toward the air.

11. The light-emitting device according to claim 10,
wherein the second layer has a film thickness of 0.6 μm or less.

12. The light-emitting device according to claim 10,
wherein the projecting portions are periodically arranged.

13. The light-emitting device according to claim 10,
wherein the projecting portions are randomly arranged.

14. The light-emitting device according to claim 10,
wherein the second layer comprises an organic film or an inorganic film.

15. The light-emitting device according to claim 10,
wherein the second layer is also formed on side surfaces of the steps.

* * * * *